(12) United States Patent
Abbasfar

(10) Patent No.: US 8,159,375 B2
(45) Date of Patent: Apr. 17, 2012

(54) SIMPLIFIED RECEIVER FOR USE IN MULTI-WIRE COMMUNICATION

(75) Inventor: Aliazam Abbasfar, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 182 days.

(21) Appl. No.: 12/679,465

(22) PCT Filed: Sep. 30, 2008

(86) PCT No.: PCT/US2008/078284
§ 371 (c)(1),
(2), (4) Date: Mar. 22, 2010

(87) PCT Pub. No.: WO2009/046014
PCT Pub. Date: Apr. 9, 2009

(65) Prior Publication Data
US 2010/0235673 A1    Sep. 16, 2010

Related U.S. Application Data

(60) Provisional application No. 60/976,666, filed on Oct. 1, 2007, provisional application No. 60/988,557, filed on Nov. 16, 2007.

(51) Int. Cl.
*H03M 5/00* (2006.01)
(52) U.S. Cl. ................................. 341/55; 341/50; 341/58
(58) Field of Classification Search .................... 341/50, 341/55
See application file for complete search history.

(56) References Cited

U.S. PATENT DOCUMENTS

| 4,498,177 | A | 2/1985 | Larson | |
|---|---|---|---|---|
| 5,892,466 | A | 4/1999 | Walker | 341/57 |
| 6,278,740 | B1 | 8/2001 | Nordyke | 375/257 |
| 6,999,516 | B1 | 2/2006 | Rajan | |
| 7,061,408 | B2 * | 6/2006 | Poechmueller | 341/55 |
| 7,184,483 | B2 * | 2/2007 | Rajan | 375/244 |
| 7,307,554 | B2 * | 12/2007 | Kojima | 341/58 |
| 7,429,876 | B1 * | 9/2008 | Chung | 326/82 |
| 7,538,699 | B2 * | 5/2009 | Bae | 341/55 |
| 2002/0130797 | A1 | 9/2002 | Calvignac et al. | |

FOREIGN PATENT DOCUMENTS

| EP | 0735729 A1 | 3/1996 |
|---|---|---|
| WO | 2006030349 A1 | 3/2006 |

OTHER PUBLICATIONS

EP Office Action with mail date of Jun. 7, 2010 re EP Application No. 08836641.4. 2 Pages.

(Continued)

*Primary Examiner* — Khai M Nguyen
(74) *Attorney, Agent, or Firm* — Park, Vaughan, Fleming & Dowler LLP

(57) ABSTRACT

An encoder encodes data into a series of parallel codewords. Each codeword is expressed two sets of logic values (e.g., a set of logic 0s and a set of logic 1s) on output nodes. The encoder selects a current codeword from a group of codewords in a codespace which does not overlap the other group of codewords, i.e., codewords in a given group of codewords are not included in any other group of codewords in the codespace. This property allows a receiver of the codewords to be simplified. In particular, a mathematical operation performed on symbols in the current codeword uniquely specifies the corresponding group of codewords. This allows a decoder to decode the current codeword using comparisons of symbols received on a subset of all possible combinations of node pairs.

29 Claims, 15 Drawing Sheets

OTHER PUBLICATIONS

Notification with mail date of Apr. 15, 2010 Concerning Transmittal of International Preliminary Report on Patentability, includes Written Opinion for PCT/US2008/078284. 6 Pages.

Poulton, J.W., et al., "Multiwire Differential Signaling," Technical Paper, University of North Carolina-Chapel Hill, Department of Computer Science, Aug. 2003. 20 Pages.

* cited by examiner

| DATA VALUE | 0 | 15 | 3 | 1 | 12 | 7 | 2 | 13 | 10 | 11 |
|---|---|---|---|---|---|---|---|---|---|---|
| DQ[3] | 0 | 1 | 0 | 0 | 1 | 0 | 0 | 1 | 1 | 1 |
| DQ[2] | 0 | 1 | 0 | 0 | 1 | 1 | 0 | 1 | 0 | 0 |
| DQ[1] | 0 | 1 | 1 | 0 | 0 | 1 | 1 | 0 | 1 | 1 |
| DQ[0] | 0 | 1 | 1 | 1 | 0 | 1 | 0 | 1 | 0 | 1 |
| a | 1 | 0 | 0 | 1 | 0 | 0 | 1 | 1 | 1 | 1 |
| b | 0 | 1 | 1 | 0 | 1 | 0 | 0 | 0 | 0 | 1 |
| c | 0 | 1 | 0 | 0 | 1 | 1 | 0 | 1 | 1 | 0 |
| d | 0 | 0 | 0 | 1 | 0 | 1 | 1 | 0 | 1 | 1 |
| e | 1 | 0 | 1 | 0 | 1 | 0 | 1 | 1 | 0 | 0 |
| f | 1 | 1 | 1 | 1 | 0 | 1 | 0 | 0 | 0 | 0 |
| CW# | 0 | 16 | 3 | 1 | 13 | 7 | 2 | 14 | 11 | 12 |
| MO | -1 | 1 | -1 | -1 | 1 | -1 | -1 | 1 | 1 | 1 |
| | T0 | T1 | T2 | T3 | T4 | T5 | T6 | T7 | T8 | T9 |

Rows a–f are labeled S[5:0].

FIG. 2

| | | T0 | T1 | T2 | T3 | T4 | T5 | T6 | T7 | T8 | T9 |
|---|---|---|---|---|---|---|---|---|---|---|---|
| DATA VALUE | | 0 | 14 | 53 | 61 | 12 | 7 | 31 | 43 | 3 | 22 |
| DQ[5] | | 0 | 0 | 1 | 1 | 0 | 0 | 0 | 1 | 0 | 0 |
| DQ[4] | | 0 | 0 | 1 | 1 | 0 | 0 | 1 | 0 | 0 | 1 |
| DQ[3] | | 0 | 1 | 0 | 1 | 1 | 0 | 1 | 1 | 0 | 0 |
| DQ[2] | | 0 | 1 | 1 | 1 | 1 | 1 | 1 | 0 | 0 | 1 |
| DQ[1] | | 0 | 1 | 0 | 0 | 0 | 1 | 1 | 1 | 1 | 1 |
| DQ[0] | | 0 | 0 | 1 | 1 | 0 | 1 | 1 | 1 | 1 | 0 |
| S[7:0] | a | 0 | 1 | 0 | 1 | 1 | 0 | 0 | 1 | 0 | 0 |
| | b | 0 | 0 | 1 | 1 | 0 | 0 | 1 | 0 | 0 | 1 |
| | c | 0 | 0 | 1 | 0 | 0 | 1 | 1 | 1 | 0 | 0 |
| | d | 1 | 0 | 1 | 1 | 0 | 0 | 0 | 0 | 1 | 1 |
| | e | 0 | 1 | 1 | 1 | 0 | 1 | 1 | 1 | 1 | 0 |
| | f | 1 | 1 | 0 | 0 | 1 | 1 | 0 | 0 | 1 | 1 |
| | g | 1 | 0 | 0 | 0 | 1 | 1 | 1 | 1 | 1 | 0 |
| | h | 1 | 1 | 0 | 0 | 1 | 0 | 0 | 0 | 0 | 1 |
| CW# | | 0 | 14 | 55 | 63 | 12 | 7 | 32 | 44 | 3 | 23 |
| MO | | -2 | -2 | 2 | 2 | -2 | -2 | 0 | 0 | -2 | 0 |

FIG. 5

SIMPLIFIED RECEIVER FOR USE IN MULTI-WIRE COMMUNICATION

TECHNICAL FIELD

Digital communication systems convey data over one or more conductors as varying voltages or currents that represent the data as series of symbols. Over a single wire, for example, relatively low and high voltages can be used to represent a logic '0' and a logic '1,' respectively. The bandwidth of a given communication channel is generally limited by the speed at which the channel can transition between different types of symbols (e.g., between relatively high and low voltages).

Multi-wire communication has been proposed as a solution for this problem. In multi-wire communication, input data is encoded as multiple symbols in codewords, which are then transmitted on an equivalent number of wires. At a receiver, the original data can be recovered by decoding signals corresponding to the received symbols on the links. Using six wires, codewords including six symbols can be communicated. In contrast, in a differential configuration, six wires can be used to communicate three symbols. Consequently, multi-wire communication offers increased communication bandwidth.

However, the complexity of the circuits used to generate the signals for decoding the codewords increases significantly as the number of wires increases. For example, many proposed multi-wire communication techniques include $M(M-1)/2$ amplifiers at the receiver, where M is the number of symbols in each codeword and is the number of wires. Thus, for six wires there may be 15 amplifiers, for eight wires there may be 28 amplifiers, and for ten wires there may be 45 amplifiers. This large number of amplifiers increases the complexity, power consumption and cost of the receiver. In addition, many proposed multi-wire communication techniques are constrained to use balanced codewords, which include an equal number of two symbol types (such as 0s and 1s), and thus have an even number of symbols in each codeword.

BRIEF DESCRIPTION OF THE FIGURES

FIG. 2 is a waveform diagram illustrating how an embodiment of encoder of FIG. 1 implements the coding technique of Table 1 to encode a sequence of four-symbol data patterns DQ[3:0] into a series of parallel symbol sets S[5:0] to be conveyed on links a through f.

FIG. 5 is a waveform diagram illustrating how an embodiment of encoder of FIG. 1 implements the coding technique of Table 2 to encode a sequence of six-symbol data patterns DQ[5:0] into a series of parallel symbol sets S[7:0] to be conveyed on links a through h.

DETAILED DESCRIPTION

Figure 1:
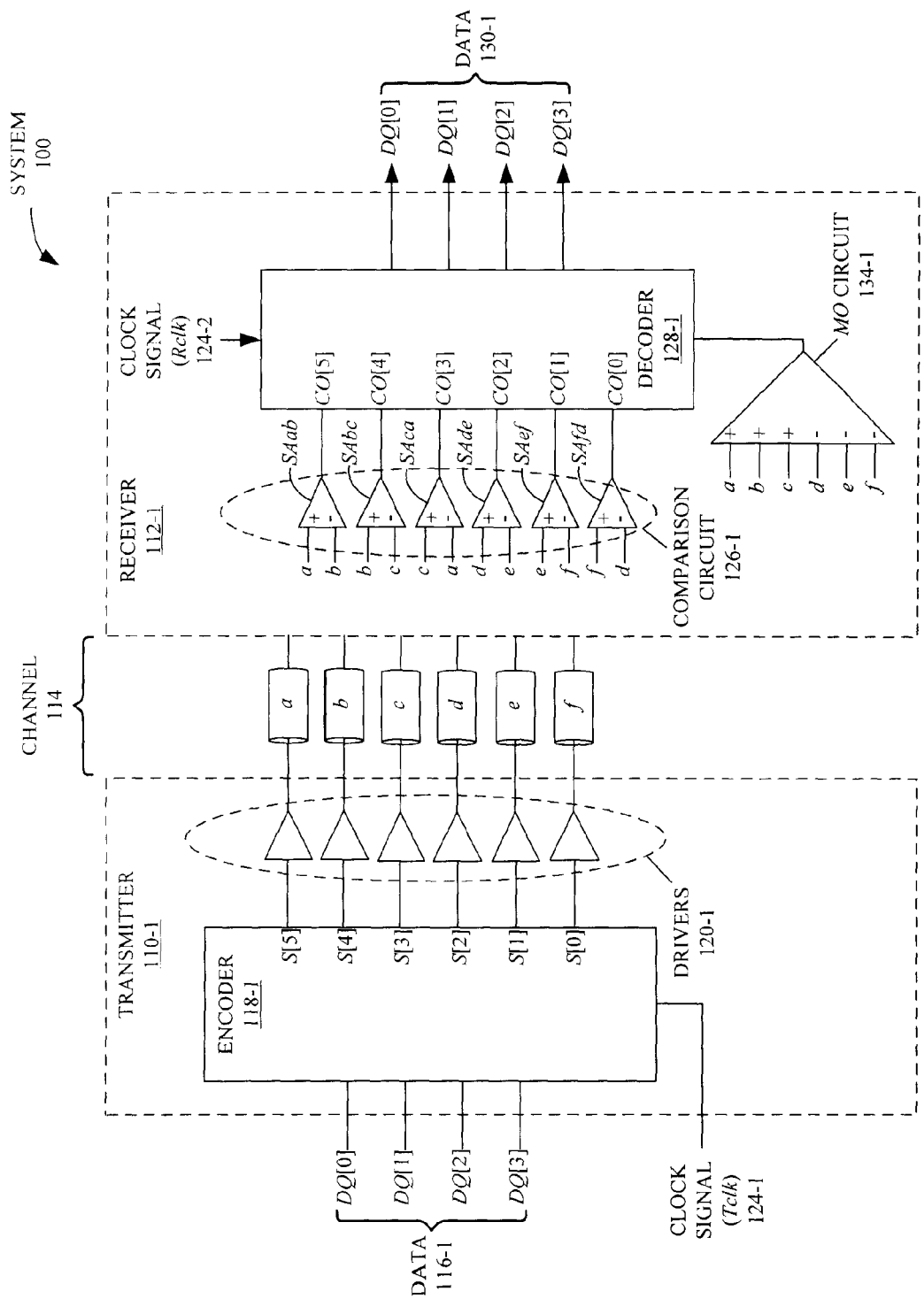
FIG. 1 is a block diagram illustrating a system that encodes and decodes four-bit data DQ[3:0] in accordance with one embodiment.

FIG. 1 presents a block diagram illustrating a system 100 that includes a transmitter 110-1 and a receiver 112-1 connected by a communication channel 114. An encoder 118-1 encodes four-bit data DQ[3:0] 116-1 into a series of parallel symbols S[5:0] in codewords for transmission over corresponding M links a, b, c, d, e and f of the channel. Each codeword is expressed as two sets of like symbols S[5:0], one representing logic 0s on a first three links (e.g., S[4:2]=000 on links b, c and d of channel 114) and another representing logic is on the remaining three links (e.g., S[1:0]=11 and S[5]=1 on links a, e and f). Thus, each codeword is balanced. For each time interval in a sequence of time intervals, encoder 118-1 selects a codeword from a given group of codewords in a codespace that includes two or more groups of codewords. These groups of codewords are non-overlapping, i.e., codewords in the given group are not included in any other group in the codespace.

This property of the codespace is used to simplify receiver 112-1. A comparison circuit 126-1 in receiver 112-1 compares the symbols on pairs of links a, b, c, d, e and f using a set of sense amplifiers SA, the outputs of which are conveyed to a decoder 128-1 as signals CO[5:0]. In addition, a mathematical operation (MO) circuit 134-1 performs a mathematical operation on the symbols on links a, b, c, d, e and f, the output of which is conveyed to the decoder 128-1. For example, the links may be divided into at least two subsets, such as {a, b, and c} and {d, e, and f}, and the mathematical operation may include the difference of the sums of the symbols in each subset. The mathematical-operation output uniquely specifies one of the groups of codewords. This additional information allows decoder 128-1 to decode the symbols using fewer number of sense amplifiers. In particular, sense amplifiers SA compare symbols associated with all pairings in the first subset {a, b, and c} and symbols associated with all pairings in the second subset {d, e, and f}. (Thus, in system 100 there are six links and six sense amplifiers SA, as opposed to M(M−1)/2 or 15 sense amplifiers when M links equals six.) This significantly reduces the complexity, power consumption and cost of receiver 112-1, thereby facilitating the use of multi-wire communication and the associated increases in communication bandwidth.

Encoder 118-1 receives four-bit data DQ[3:0] on edges of an internal or external transmit clock signal Tclk 124-1. The resulting codewords S[5:0] are provided as analog or digital signals by drivers 120-1 onto links a through f. In a typical example, transmitter 110-1 and receiver 112-1 are on respective integrated circuits (ICs), such as a memory controller IC and a memory device IC. The following discussion refers to elements a through f alternatively as 'links' or 'nodes.' The former refers to the entire AC- or DC-coupled signal path between encoder 118-1 and comparison circuit 126-1, whereas the latter refers to an input or output pin, wire, or terminal.

The label for each sense amplifier in comparison circuit 126-1 includes two lowercase characters that correspond to the compared input nodes. For example, sense amplifier SAab compares input nodes a and b from like-named links of channel 114. Decoder 128-1 samples the outputs from comparison circuit 126-1 and the output from mathematical-operation circuit 134-1 on edges of a receive clock signal Rclk 124-2, and decodes the resultant sample sets to recover data DQ[3:0] 130-1. As described further below, the mathematical-operation output unique identifies the group of codewords in the codespace, which decoder 128-1 uses to decode the current codeword.

Table 1 illustrates a codespace with 20 balanced codewords, which have an equal number of 0s and 1s, and which may be communicated using six links or nodes. Symbols on the nodes for each codeword can be divided into two sets of three, a first set of three nodes with symbols that represent logic 0s and a second set of three nodes with symbols that represent logic 1s. For each four bits of data DQ[3:0] 116-1 received, encoder 118-1 selects a corresponding codeword from Table 1. The codespace illustrated in Table 1 is divided into two groups of codewords, a first group of codewords (codeword numbers or CDW#s 0-9) and a second group of codewords (codeword numbers 10-19), which can be uniquely identified from the symbols on nodes a-f by performing a mathematical operation. This division of the codespace reduces the total number of codewords in the codespace, but still leaves sufficient codewords to communicate four bits of data DQ[3:0] 116-1 in each time interval. In Table 1, there are 18 valid codewords (codewords 9 and 19 are invalid), which can be used to communicate 16 values corresponding to four-binary bits (two of the valid codewords in Table 1, one in each group of codewords, may be used to communicate information other than data DQ[3:0] 116-1).

TABLE 1

| | Codeword S[5:0] For Links | | | | | | Comparison Circuit 126-1 Outputs | | | Comparison Circuit 126-1 Outputs | | | Mathematical-Operation Output |
|---|---|---|---|---|---|---|---|---|---|---|---|---|---|
| CDW# | a | b | c | d | e | f | a − b | b − c | c − a | d − e | e − f | f − d | (a + b + c) − (d + e + f) |
| 0 | 1 | 0 | 0 | 0 | 1 | 1 | 1 | x | 0 | 0 | x | 1 | −1 |
| 1 | 1 | 0 | 0 | 1 | 0 | 1 | 1 | x | 0 | 1 | 0 | x | −1 |
| 2 | 1 | 0 | 0 | 1 | 1 | 0 | 1 | x | 0 | x | 1 | 0 | −1 |
| 3 | 0 | 1 | 0 | 0 | 1 | 1 | 0 | 1 | x | 0 | x | 1 | −1 |
| 4 | 0 | 1 | 0 | 1 | 0 | 1 | 0 | 1 | x | 1 | 0 | x | −1 |
| 5 | 0 | 1 | 0 | 1 | 1 | 0 | 0 | 1 | x | x | 1 | 0 | −1 |
| 6 | 0 | 0 | 1 | 0 | 1 | 1 | x | 0 | 1 | 0 | x | 1 | −1 |
| 7 | 0 | 0 | 1 | 1 | 0 | 1 | x | 0 | 1 | 1 | 0 | x | −1 |
| 8 | 0 | 0 | 1 | 1 | 1 | 0 | x | 0 | 1 | x | 1 | 0 | −1 |
| 9 | 0 | 0 | 0 | 1 | 1 | 1 | x | x | x | x | x | x | −1 |
| 10 | 0 | 1 | 1 | 1 | 0 | 0 | 0 | x | 1 | 1 | x | 0 | 1 |
| 11 | 1 | 0 | 1 | 1 | 0 | 0 | 1 | 0 | x | 1 | x | 0 | 1 |
| 12 | 1 | 1 | 0 | 1 | 0 | 0 | x | 1 | 0 | 1 | x | 0 | 1 |
| 13 | 0 | 1 | 1 | 0 | 1 | 0 | 0 | x | 1 | 0 | 1 | x | 1 |
| 14 | 1 | 0 | 1 | 0 | 1 | 0 | 1 | 0 | x | 0 | 1 | x | 1 |
| 15 | 1 | 1 | 0 | 0 | 1 | 0 | x | 1 | 0 | 0 | 1 | x | 1 |
| 16 | 0 | 1 | 1 | 0 | 0 | 1 | 0 | x | 1 | x | 0 | 1 | 1 |
| 17 | 1 | 0 | 1 | 0 | 0 | 1 | 1 | 0 | x | x | 0 | 1 | 1 |
| 18 | 1 | 1 | 0 | 0 | 0 | 1 | x | 1 | 0 | x | 0 | 1 | 1 |
| 19 | 1 | 1 | 1 | 0 | 0 | 0 | x | x | x | x | x | x | 1 |

As illustrated in Table 1, each of sense amplifiers SA in comparison circuit 126-1 can have one of three output values. For example, sense amplifier SAfd, which receives symbols on input nodes f and d, outputs:

1. a voltage representative of a logic 0 (e.g., a negative voltage −Vp) when symbols S[0] and S[2] on respective input nodes f and d express logic values of 0 and 1, respectively;
2. a voltage representative of a logic 1 (e.g., a positive voltage +Vp) when input nodes f and d express logic values of 1 and 0, respectively; and
3. an intermediate voltage (e.g., a voltage Vint) represented by an 'x', when input nodes f and d express like logic values (i.e., are both 1 or both 0).

Each valid codeword of Table 1 causes two sense amplifiers to output the intermediate voltage Vint and the remaining four to output a positive or negative voltage ±Vp. When the group of codewords is specified by the mathematical-operation output, decoder 128-1 can decode the outputs from the sense amplifiers to recover the encoded four-bit data DQ[3:0] 130-1. Decoder 128-1 may ignore sense amplifier outputs with the intermediate voltage (Vint) when performing the decoding.

By determining the group of codewords for current received symbols using mathematical operation circuit 134-1, the number of sense amplifiers SA in comparison circuit 126-1 can be reduced. In particular, the number of sense amplifiers SA may be less than or equal to M(M−1)/2, where M is the number of symbols in each codeword and is the number of links. For example, the number of sense amplifiers SA may be M(M/2−1)/2. (Thus, codewords, which contain six symbols that are communicated on six links, can be decoded using six sense amplifiers.) Consequently, this approach may be used to significantly reduce the number of sense amplifiers SA in comparison circuit 126-1.

FIG. 2 presents a waveform diagram 200 illustrating how an embodiment of encoder 118-1 (FIG. 1) implements the coding technique of Table 1 to encode a sequence of four-symbol data patterns DQ[3:0] 116-1 (FIG. 1) into a series of parallel symbol sets S[5:0] for transmission across a six-link channel. This encoding and decoding technique offers the benefits of multi-wire communication (including increased communication bandwidth) without commensurate increases in the complexity, power consumption and cost of receiver 112-1 (FIG. 1).

As noted previously, the bit positions of symbols S[5:0] correspond to respective links a, b, c, d, e and f (e.g., S[5] is the logic value expressed on link a). The encoding technique encodes each codeword in a series of time intervals T0-T9 of FIG. 2 using two groups of codewords in a codespace. For example, at time T0, a group of codewords, in this case the first group of codewords, is used to encode data DQ[3:0]. In particular, data value 0 (data DQ[3:0]=0000) is encoded as codeword 0, which is expressed as symbols S[5:0]=100011, and is transmitted. As shown in Table 1, this codeword (as well as the subsequent codewords) can be decoded using sense amplifier outputs SAab, SAbc, SAca, SAde, SAef, and SAfd, in conjunction with the mathematical-operation output. The sum of the symbols on the first subset of links {a, b, and c} is 1 and the sum of the symbols on the second subset of links {d, e, and f} is 2. The difference of these sums is −1, which (correctly) corresponds to the first group of codewords.

Then at time T1, encoder 118-1 (FIG. 1) uses the second group of codewords to encode data DQ[3:0]. In particular, data value 15 (data DQ[3:0]=1111) is encoded as codeword 16, which is expressed as symbols S[5:0]=011001, and is transmitted. The sum of the symbols on the first subset of links {a, b, and c} is 2 and the sum of the symbols on the second subset of links {d, e, and f} is 1. The difference of these sums is 1, which corresponds to the second group of codewords.

Each subsequent codeword is similarly encoded in a manner that ensures that the mathematical-operation output specifies the group of codewords used. While not shown in FIG. 2, the encoding technique can use the same codeword for successive time intervals if the same data DQ[3:0] is encoded for these time intervals. As described further below with reference to FIGS. 6A and 6B, the encoding technique can be extended to different codespaces in which the numbers of 0s and 1s (and, more generally, the number of each symbol type in each codeword) are unequal, i.e., using a codespace that includes unbalanced codewords.

Figure 3A:
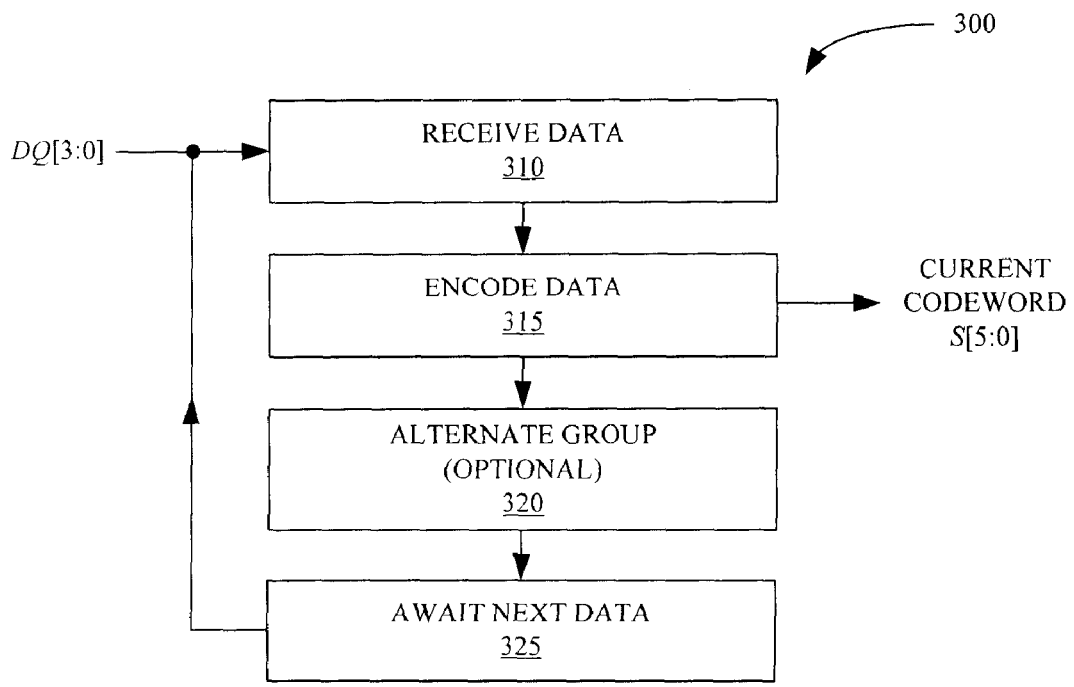
FIG. 3A is a flowchart depicting the operation of the encoder of FIG. 1 in accordance with one embodiment.

FIG. 3A presents a flowchart 300 depicting the operation of the encoder 118-1 (FIG. 1). Beginning the encoding sequence at operation 310, current data DQ[3:0] 116-1 (FIG. 1) is received. Then, encoder 118-1 (FIG. 1) encodes current data DQ[3:0] 116-1 (FIG. 1) into symbols in the current codeword in a current group of codewords on the nodes (operation 315). In some embodiments (such as those described below with reference to FIGS. 6A and 6B), encoder 118-1 (FIG. 1) optionally selects another (different) group of codewords (operation 320) to use when encoding subsequent data DQ[3:0] 116-1 (FIG. 1). Next, encoder 118-1 (FIG. 1) awaits subsequent data DQ[3:0] 116 (FIG. 1) for the next time interval (operation 325). The flow of operations 310 through 325 repeats for data DQ[3:0] 116-1 (FIG. 1) in each successive time interval.

Figure 3B:
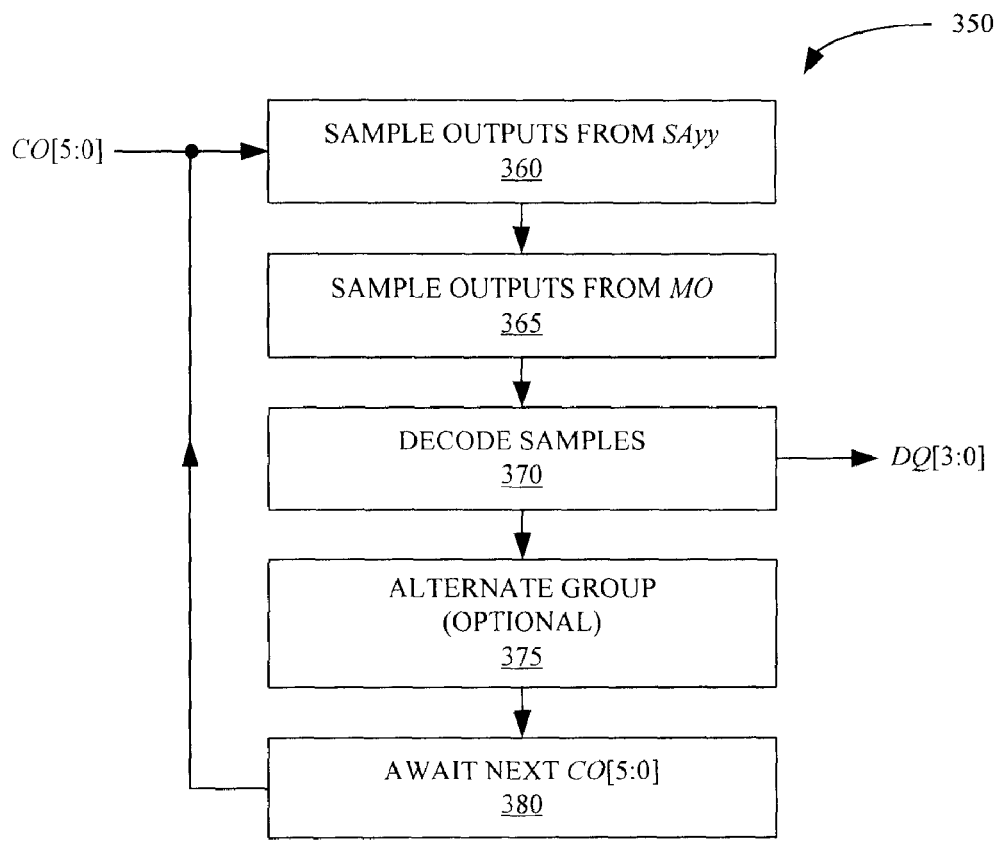
FIG. 3B is a flowchart depicting the operation of decoder of FIG. 1 in accordance with the decoding technique of Table 1.

FIG. 3B presents a flowchart 350 depicting the operation of decoder 128-1 (FIG. 1) in accordance with the decoding technique of Table 1. Beginning the decoding sequence at operation 360, decoder 128-1 (FIG. 1) receives the outputs from comparison circuit 126-1 (FIG. 1) as a six-symbol set CO[5:0] (FIG. 1). For each codeword, decoder 128-1 (FIG. 1) samples the outputs from these sense amplifiers SAyy (operation 360) and samples the output from mathematical-operation circuit 134-1 (FIG. 1) (operation 365). Based on the group of codewords specified by the output of the mathematical operation, decoder 128-1 (FIG. 1) decodes the outputs from the sense amplifiers SAyy to produce the encoded data DQ[3:0] 130-1 (FIG. 1) (operation 370). In some embodiments (such as those described below with reference to FIGS. 6A and 6B), decoder 128-1 (FIG. 1) optionally selects another (different) group of codewords (operation 375) to use when decoding the subsequent six-symbol set CO[5:0] (FIG. 1). Next, decoder 128-1 (FIG. 1) awaits the subsequent six-symbol set CO[5:0] (FIG. 1) for the next time interval (operation 380). The flow of operations 360 through 380 repeats for each successive codeword.

Figure 4A:
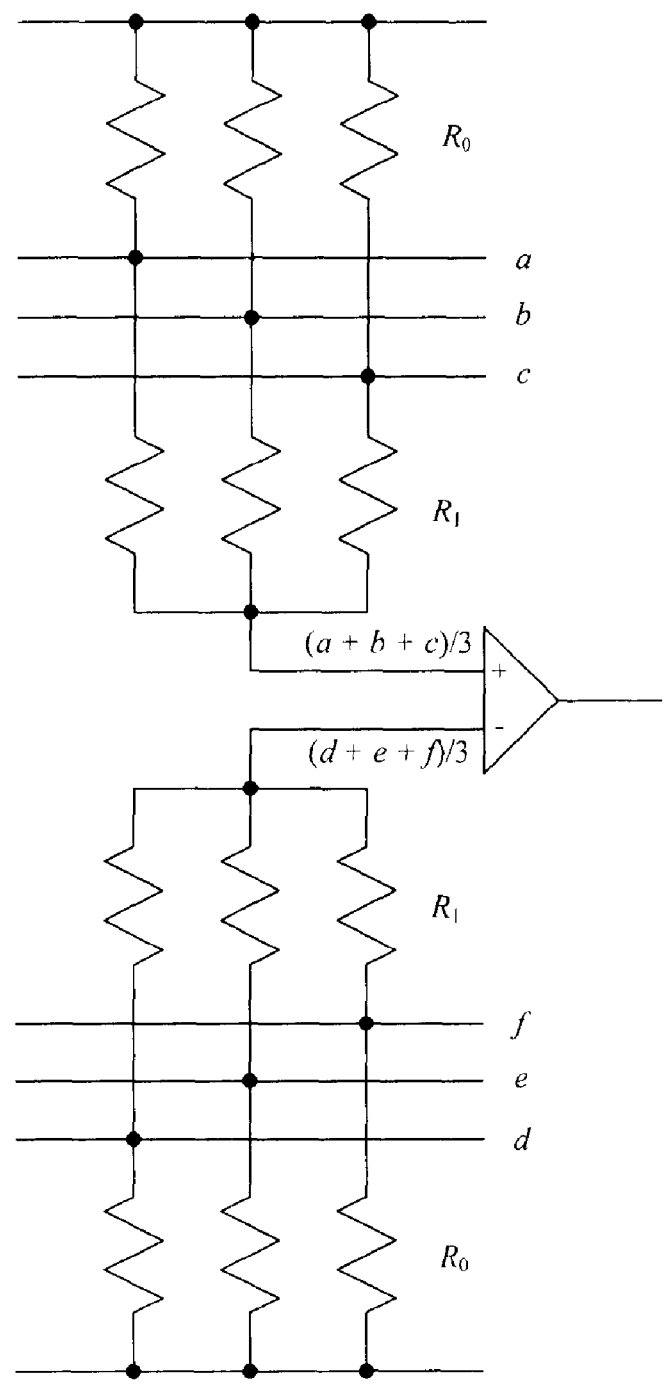
FIG. 4A is a block diagram illustrating a mathematical-operation circuit of receiver in FIG. 1 in accordance with one embodiment.
Figure 4B:
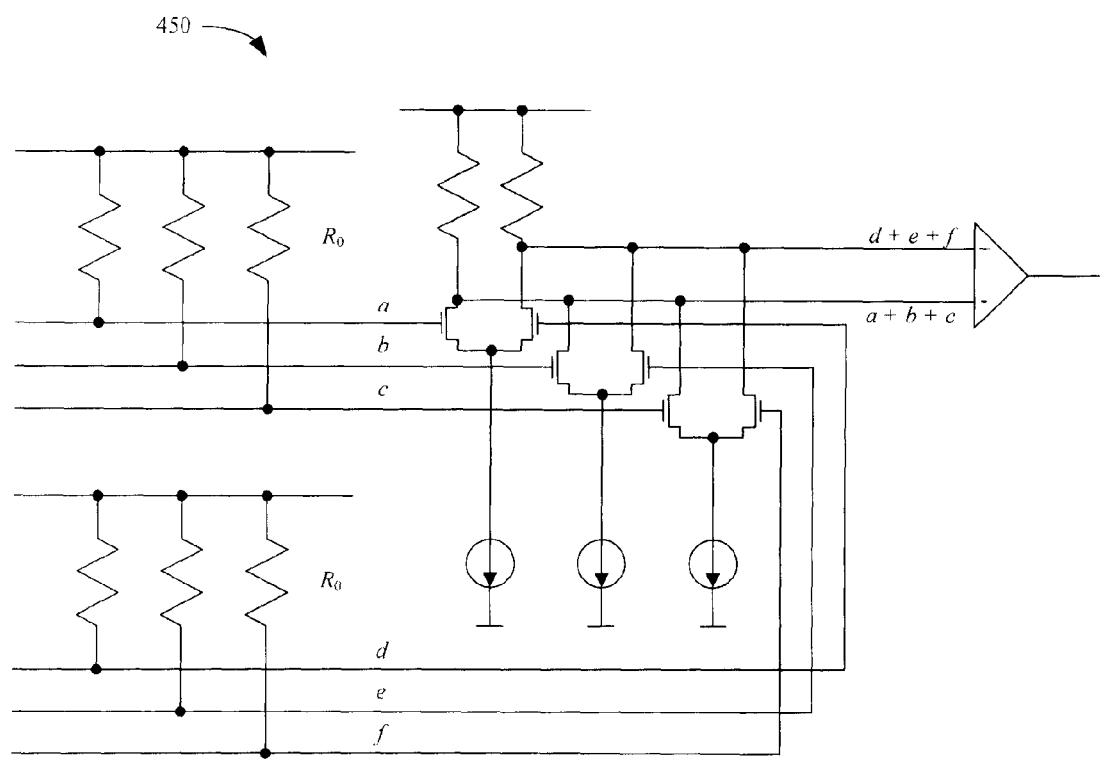
FIG. 4B is a block diagram illustrating a mathematical-operation circuit of receiver in FIG. 1 in accordance with one embodiment.

FIG. 4A presents a block diagram illustrating a mathematical-operation circuit 400 of receiver 112-1 (FIG. 1). In this mathematical-operation circuit, passive-resistive averaging is used in conjunction with a differential amplifier to implement the mathematical operation. Moreover, resistance $R_1$ may be much larger than resistance $R_0$. For example, $R_1$ may be 10 times $R_0$. Alternatively, active-current summation may be used in conjunction with a differential amplifier. This is shown in FIG. 4B, which presents a block diagram illustrating a mathematical-operation circuit 450 of receiver 112-1 (FIG. 1).

While the foregoing discussion illustrated the encoding and decoding technique using a codespace in which four-bit data DQ[3:0] 116-1 (FIG. 1) is encoded using six-symbol codewords, other codespaces may be used. Table 2 illustrates a codespace with 68 balanced codewords, which have an equal number of 0s and 1s, and which may be communicated using eight links or nodes. Symbols on the nodes for each codeword can be divided into two sets of four, a first set of four nodes with symbols that represent logic 0s and a second set of four nodes with symbols that represent logic 1s. For each six bits of data DQ[5:0] received, encoder 118-1 (FIG. 1) selects a corresponding codeword from Table 2. The codespace illustrated in Table 2 is divided into three groups of codewords, a first group of codewords (codeword numbers 0-15), a second group of codewords (codeword numbers 16-51) and a third group of codewords (codeword numbers 52-67), which can be uniquely identified from the symbols on nodes a-h by performing a mathematical operation. This division of the codespace reduces the total number of codewords, but still leaves sufficient codewords to communicate six bits of data DQ[5:0] in each time interval. In Table 2, 64 codewords may be used to communicate six-binary bits (four of these codewords, e.g., one in the first group, two in the second group, and one in the third group, may be used to communicate information other than data DQ[5:0]).

TABLE 2

| CDW# | Codeword S[7:0] For Links | | | | | | | | Comparison Circuit 126-1 Outputs | | | | | | Comparison Circuit 126-1 Outputs | | | | | | Mathematical-Operation Output (a + b + c + d) − (e + f + g + h) |
|---|---|---|---|---|---|---|---|---|---|---|---|---|---|---|---|---|---|---|---|---|---|
| | a | b | c | d | e | f | g | h | a−b | a−c | a−d | b−c | b−d | c−d | e−f | e−g | e−h | f−g | f−h | g−h | |
| 0 | 0 | 0 | 0 | 1 | 0 | 1 | 1 | 1 | x | x | 0 | x | 0 | 0 | 0 | 0 | 0 | x | x | x | −2 |
| 1 | 0 | 0 | 0 | 1 | 1 | 0 | 1 | 1 | x | x | 0 | x | 0 | 0 | 1 | x | x | 0 | 0 | x | −2 |
| 2 | 0 | 0 | 0 | 1 | 1 | 1 | 0 | 1 | x | x | 0 | x | 0 | 0 | x | 1 | x | 1 | x | 0 | −2 |
| 3 | 0 | 0 | 0 | 1 | 1 | 1 | 1 | 0 | x | x | 0 | x | 0 | 0 | x | x | 1 | x | 1 | 1 | −2 |
| 4 | 0 | 0 | 1 | 0 | 0 | 1 | 1 | 1 | x | 0 | x | 0 | x | 1 | 0 | 0 | 0 | x | x | x | −2 |
| 5 | 0 | 0 | 1 | 0 | 1 | 0 | 1 | 1 | x | 0 | x | 0 | x | 1 | 1 | x | x | 0 | 0 | x | −2 |
| 6 | 0 | 0 | 1 | 0 | 1 | 1 | 0 | 1 | x | 0 | x | 0 | x | 1 | x | 1 | x | 1 | x | 0 | −2 |
| 7 | 0 | 0 | 1 | 0 | 1 | 1 | 1 | 0 | x | 0 | x | 0 | x | 1 | x | x | 1 | x | 1 | 1 | −2 |
| 8 | 0 | 1 | 0 | 0 | 0 | 1 | 1 | 1 | 0 | x | x | 1 | 1 | x | 0 | 0 | 0 | x | x | x | −2 |
| 9 | 0 | 1 | 0 | 0 | 1 | 0 | 1 | 1 | 0 | x | x | 1 | 1 | x | 1 | x | x | 0 | 0 | x | −2 |
| 10 | 0 | 1 | 0 | 0 | 1 | 1 | 0 | 1 | 0 | x | x | 1 | 1 | x | x | 1 | x | 1 | x | 0 | −2 |
| 11 | 0 | 1 | 0 | 0 | 1 | 1 | 1 | 0 | 0 | x | x | 1 | 1 | x | x | x | 1 | x | 1 | 1 | −2 |
| 12 | 1 | 0 | 0 | 0 | 0 | 1 | 1 | 1 | 1 | 1 | 1 | x | x | x | 0 | 0 | 0 | x | x | x | −2 |
| 13 | 1 | 0 | 0 | 0 | 1 | 0 | 1 | 1 | 1 | 1 | 1 | x | x | x | 1 | x | x | 0 | 0 | x | −2 |
| 14 | 1 | 0 | 0 | 0 | 1 | 1 | 0 | 1 | 1 | 1 | 1 | x | x | x | x | 1 | x | 1 | x | 0 | −2 |
| 15 | 1 | 0 | 0 | 0 | 1 | 1 | 1 | 0 | 1 | 1 | 1 | x | x | x | x | x | 1 | x | 1 | 1 | −2 |
| 16 | 0 | 0 | 1 | 1 | 0 | 0 | 1 | 1 | x | 0 | 0 | 0 | 0 | x | 0 | 0 | 0 | 0 | 0 | x | 0 |
| 17 | 0 | 0 | 1 | 1 | 0 | 1 | 0 | 1 | x | 0 | 0 | 0 | 0 | x | 0 | x | 0 | 1 | x | 0 | 0 |
| 18 | 0 | 0 | 1 | 1 | 0 | 1 | 1 | 0 | x | 0 | 0 | 0 | 0 | x | 0 | 0 | x | x | 1 | 1 | 0 |
| 19 | 0 | 0 | 1 | 1 | 1 | 0 | 0 | 1 | x | 0 | 0 | 0 | 0 | x | 1 | 1 | x | x | 0 | 0 | 0 |
| 20 | 0 | 0 | 1 | 1 | 1 | 0 | 1 | 0 | x | 0 | 0 | 0 | 0 | x | 1 | x | 1 | 0 | x | 1 | 0 |
| 21 | 0 | 0 | 1 | 1 | 1 | 1 | 0 | 0 | x | 0 | 0 | 0 | 0 | x | x | 1 | 1 | 1 | 1 | x | 0 |
| 22 | 0 | 1 | 0 | 1 | 0 | 0 | 1 | 1 | 0 | x | 0 | 1 | x | 0 | x | 0 | 0 | 0 | 0 | x | 0 |
| 23 | 0 | 1 | 0 | 1 | 0 | 1 | 0 | 1 | 0 | x | 0 | 1 | x | 0 | 0 | 0 | x | x | 1 | 1 | 0 |
| 24 | 0 | 1 | 0 | 1 | 0 | 1 | 1 | 0 | 0 | x | 0 | 1 | x | 0 | 0 | 0 | x | x | 1 | 1 | 0 |
| 25 | 0 | 1 | 0 | 1 | 1 | 0 | 0 | 1 | 0 | x | 0 | 1 | x | 0 | 1 | 1 | x | x | 0 | 0 | 0 |
| 26 | 0 | 1 | 0 | 1 | 1 | 0 | 1 | 0 | 0 | x | 0 | 1 | x | 0 | 1 | x | 1 | 0 | x | 1 | 0 |
| 27 | 0 | 1 | 0 | 1 | 1 | 1 | 0 | 0 | 0 | x | 0 | 1 | x | 0 | x | 1 | 1 | 1 | 1 | x | 0 |
| 28 | 0 | 1 | 1 | 0 | 0 | 0 | 1 | 1 | 0 | 0 | x | x | 1 | 1 | x | 0 | 0 | 0 | 0 | x | 0 |
| 29 | 0 | 1 | 1 | 0 | 0 | 1 | 0 | 1 | 0 | 0 | x | x | 1 | 1 | 0 | x | 0 | 1 | x | 0 | 0 |
| 30 | 0 | 1 | 1 | 0 | 0 | 1 | 1 | 0 | 0 | 0 | x | x | 1 | 1 | 0 | 0 | x | x | 1 | 1 | 0 |
| 31 | 0 | 1 | 1 | 0 | 1 | 0 | 0 | 1 | 0 | 0 | x | x | 1 | 1 | 1 | 1 | x | x | 0 | 0 | 0 |
| 32 | 0 | 1 | 1 | 0 | 1 | 0 | 1 | 0 | 0 | 0 | x | x | 1 | 1 | 1 | x | 1 | 0 | x | 1 | 0 |
| 33 | 0 | 1 | 1 | 0 | 1 | 1 | 0 | 0 | 0 | 0 | x | x | 1 | 1 | x | 1 | 1 | 1 | 1 | x | 0 |
| 34 | 1 | 0 | 0 | 1 | 0 | 0 | 1 | 1 | 1 | 1 | x | x | 0 | 0 | x | 0 | 0 | 0 | 0 | x | 0 |
| 35 | 1 | 0 | 0 | 1 | 0 | 1 | 0 | 1 | 1 | 1 | x | x | 0 | 0 | 0 | x | 0 | 1 | x | 0 | 0 |
| 36 | 1 | 0 | 0 | 1 | 0 | 1 | 1 | 0 | 1 | 1 | x | x | 0 | 0 | 0 | 0 | x | x | 1 | 1 | 0 |
| 37 | 1 | 0 | 0 | 1 | 1 | 0 | 0 | 1 | 1 | 1 | x | x | 0 | 0 | 1 | 1 | x | x | 0 | 0 | 0 |
| 38 | 1 | 0 | 0 | 1 | 1 | 0 | 1 | 0 | 1 | 1 | x | x | 0 | 0 | 1 | x | 1 | 0 | x | 1 | 0 |
| 39 | 1 | 0 | 0 | 1 | 1 | 1 | 0 | 0 | 1 | 1 | x | x | 0 | 0 | x | 1 | 1 | 1 | 1 | x | 0 |
| 40 | 1 | 0 | 1 | 0 | 0 | 0 | 1 | 1 | 1 | x | 1 | 0 | x | 1 | x | 0 | 0 | 0 | 0 | x | 0 |
| 41 | 1 | 0 | 1 | 0 | 0 | 1 | 0 | 1 | 1 | x | 1 | 0 | x | 1 | 0 | x | 0 | 1 | x | 0 | 0 |
| 42 | 1 | 0 | 1 | 0 | 0 | 1 | 1 | 0 | 1 | x | 1 | 0 | x | 1 | 0 | 0 | x | x | 1 | 1 | 0 |
| 43 | 1 | 0 | 1 | 0 | 1 | 0 | 0 | 1 | 1 | x | 1 | 0 | x | 1 | 1 | 1 | x | x | 0 | 0 | 0 |
| 44 | 1 | 0 | 1 | 0 | 1 | 0 | 1 | 0 | 1 | x | 1 | 0 | x | 1 | 1 | x | 1 | 0 | x | 1 | 0 |
| 45 | 1 | 0 | 1 | 0 | 1 | 1 | 0 | 0 | 1 | x | 1 | 0 | x | 1 | x | 1 | 1 | 1 | 1 | x | 0 |
| 46 | 1 | 1 | 0 | 0 | 0 | 0 | 1 | 1 | x | 1 | 1 | 1 | 1 | x | x | 0 | 0 | 0 | 0 | x | 0 |
| 47 | 1 | 1 | 0 | 0 | 0 | 1 | 0 | 1 | x | 1 | 1 | 1 | 1 | x | 0 | x | 0 | 1 | x | 0 | 0 |
| 48 | 1 | 1 | 0 | 0 | 0 | 1 | 1 | 0 | x | 1 | 1 | 1 | 1 | x | 0 | 0 | x | x | 1 | 1 | 0 |
| 49 | 1 | 1 | 0 | 0 | 1 | 0 | 0 | 1 | x | 1 | 1 | 1 | 1 | x | 1 | 1 | x | x | 0 | 0 | 0 |
| 50 | 1 | 1 | 0 | 0 | 1 | 0 | 1 | 0 | x | 1 | 1 | 1 | 1 | x | 1 | x | 1 | 0 | x | 1 | 0 |
| 51 | 1 | 1 | 0 | 0 | 1 | 1 | 0 | 0 | x | 1 | 1 | 1 | 1 | x | x | 1 | 1 | 1 | 1 | x | 0 |
| 52 | 0 | 1 | 1 | 1 | 0 | 0 | 0 | 1 | 0 | 0 | 0 | x | x | x | x | x | 0 | x | 0 | 0 | 2 |
| 53 | 0 | 1 | 1 | 1 | 0 | 0 | 1 | 0 | 0 | 0 | 0 | x | x | x | x | 0 | x | 0 | x | 1 | 2 |
| 54 | 0 | 1 | 1 | 1 | 0 | 1 | 0 | 0 | 0 | 0 | 0 | x | x | x | 0 | x | x | 1 | 1 | x | 2 |
| 55 | 0 | 1 | 1 | 1 | 1 | 0 | 0 | 0 | 0 | 0 | 0 | x | x | x | 1 | 1 | 1 | x | x | x | 2 |
| 56 | 1 | 0 | 1 | 1 | 0 | 0 | 0 | 1 | 1 | x | x | 0 | 0 | x | x | x | 0 | x | 0 | 0 | 2 |
| 57 | 1 | 0 | 1 | 1 | 0 | 0 | 1 | 0 | 1 | x | x | 0 | 0 | x | x | 0 | x | 0 | x | 1 | 2 |
| 58 | 1 | 0 | 1 | 1 | 0 | 1 | 0 | 0 | 1 | x | x | 0 | 0 | x | 0 | x | x | 1 | 1 | x | 2 |
| 59 | 1 | 0 | 1 | 1 | 1 | 0 | 0 | 0 | 1 | x | x | 0 | 0 | x | 1 | 1 | 1 | x | x | x | 2 |
| 60 | 1 | 1 | 0 | 1 | 0 | 0 | 0 | 1 | x | 1 | 0 | 1 | x | 0 | x | x | 0 | x | 0 | 0 | 2 |
| 61 | 1 | 1 | 0 | 1 | 0 | 0 | 1 | 0 | x | 1 | 0 | 1 | x | 0 | x | 0 | x | 0 | x | 1 | 2 |
| 62 | 1 | 1 | 0 | 1 | 0 | 1 | 0 | 0 | x | 1 | 0 | 1 | x | 0 | 0 | x | x | 1 | 1 | x | 2 |
| 63 | 1 | 1 | 0 | 1 | 1 | 0 | 0 | 0 | x | 1 | 0 | 1 | x | 0 | 1 | 1 | 1 | x | x | x | 2 |
| 64 | 1 | 1 | 1 | 0 | 0 | 0 | 0 | 1 | x | x | 1 | x | 1 | 1 | x | x | 0 | x | 0 | 0 | 2 |
| 65 | 1 | 1 | 1 | 0 | 0 | 0 | 1 | 0 | x | x | 1 | x | 1 | 1 | x | 0 | x | 0 | x | 1 | 2 |
| 66 | 1 | 1 | 1 | 0 | 0 | 1 | 0 | 0 | x | x | 1 | x | 1 | 1 | 0 | x | x | 1 | 1 | x | 2 |
| 67 | 1 | 1 | 1 | 0 | 1 | 0 | 0 | 0 | x | x | 1 | x | 1 | 1 | 1 | 1 | 1 | x | x | x | 2 |

Once the group of codewords is specified (based on the mathematical-operation output), decoder 128-1 (FIG. 1) can decode the codewords in Table 2 using 12 sense amplifiers SA to recover the encoded six-bit data DQ[5:0]. Codewords of Table 2 in the first and the third group of codewords cause six of these sense amplifiers to output the intermediate voltage Vint and the remaining six to output a positive or negative voltage ±Vp. However, codewords of Table 2 in the second group of codewords cause four of these sense amplifiers to output the intermediate voltage Vint and the remaining eight to output a positive or negative voltage ±Vp.

FIG. 5 presents a waveform diagram 500 illustrating how an embodiment of encoder 118-1 (FIG. 1) implements the coding technique of Table 2 to encode a sequence of six-symbol data patterns DQ[5:0] into a series of parallel symbol sets S[7:0] for transmission across an eight-link channel. The encoding technique encodes each codeword in a series of time intervals T0-T9 of FIG. 5 using three groups of codewords in a codespace. For example, at time T0, a group of codewords, in this case the first group of codewords, is used to encode data DQ[5:0]. In particular, data value 0 (data DQ[5:0]=000000) is encoded as codeword 0, which is expressed as symbols S[7:0]=00010111, and is transmitted. As shown in Table 2, this codeword (as well as the subsequent codewords) can be decoded using sense amplifier outputs SAab, SAac, SAad, SAbc, SAbd, SAcd, SAef, SAeg, SAeh, SAfg, SAfh and SAgh in conjunction with the mathematical-operation output. In this example, the mathematical operation is the difference of the sums of a first subset of the links {a, b, c, and d} and a second subset of the links {e, f, g, and h}. For time T0, the sum of the symbols on the first subset of links is 1 and the sum of the symbols on the second subset of links is 3. The difference of these sums is −2, which corresponds to the first group of codewords.

Then at time T1, encoder 118-1 (FIG. 1) uses the second group of codewords to encode data DQ[5:0]. In particular, data value 14 (data DQ[5:0]=001110) is encoded as codeword 14, which is expressed as symbols S[7:0]=10001101, and is transmitted. The sum of the symbols on the first subset of links is 1 and the sum of the symbols on the second subset of links is 3. The difference of these sums is −2, which corresponds to the first group of codewords.

Each subsequent codeword is similarly encoded in a manner that ensures that the mathematical-operation output specifies the group of codewords used. While not shown in FIG. 5, the encoding technique can use the same codeword for successive time intervals if the same data DQ[5:0] is encoded for these time intervals.

The use of balanced codewords in the foregoing embodiments eliminates simultaneous switching noise and the total current at receiver 112-1 (FIG. 1) for each time interval is therefore zero (because the are an equal number of 0s and 1s in the symbol set for each codeword). More generally, simultaneous switching noise can be eliminated if a first number of 0s and a second number of 1s are used during even time intervals, and the second number of 0s and the first number of 1s are used during odd time intervals. This approach allows the use of codespaces in which M is an odd integer. In these embodiments, the codespaces may or may not be divided into groups of codewords. If such a codespace is not divided into groups of codewords, outputs from up to M(M−1)/2 sense amplifiers in a comparison circuit may be used to decode received symbol sets. In particular, in these embodiments codewords are decoded using comparisons of all combinations of symbols received on pairs of links.

Figure 6A:
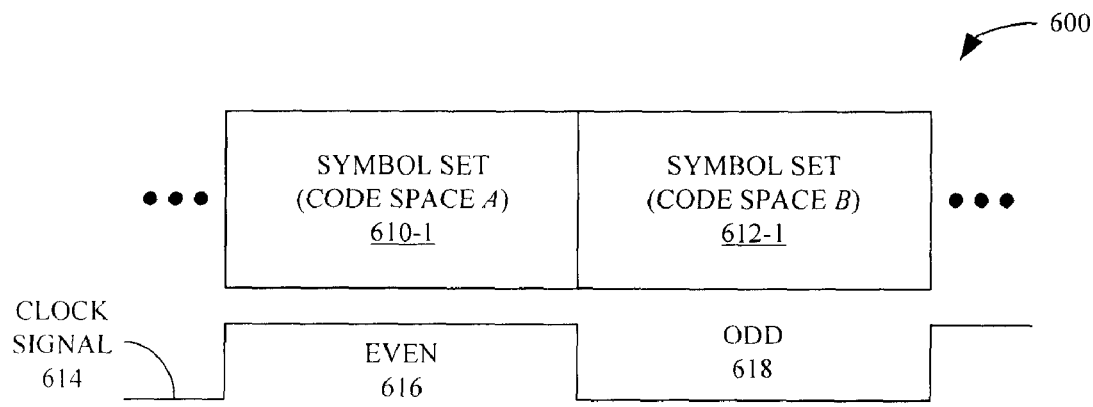
FIG. 6A is a block diagram illustrating alternating coding by encoder of FIG. 1 in accordance with one embodiment.

FIG. 6A presents a block diagram 600 illustrating alternating coding by encoder 118-1 (FIG. 1). During this alternate encoding, a first codespace (codespace A) is used to encode symbol set 610-1 for a first time interval (such as even half 616 of the period of clock signal 614) and a second codespace (codespace B) is used to encode symbol set 612-1 for a second, immediately adjacent time interval (such as odd half 618 of the period of clock signal 614). These codespaces may include codewords with an odd number of symbols. Moreover, for each codeword, the number of 0s in the first codespace may equal the number of 1s in the second codespace, and the number of 1s in the first codespace may equal the number of 0s in the second codespace. Thus, over the period of clock signal 614 an equal number of 0s and 1s occur, which eliminates simultaneous switching noise in receiver 112-1 (FIG. 1).

While FIG. 6A illustrates alternating encoding for half of the clock period, in other embodiments the first time interval and the second time interval may each be a full clock period. Moreover, while codespaces with an odd number of codewords are used as an illustration, in other embodiments codespaces with an even number of codewords are used.

Figure 6B:
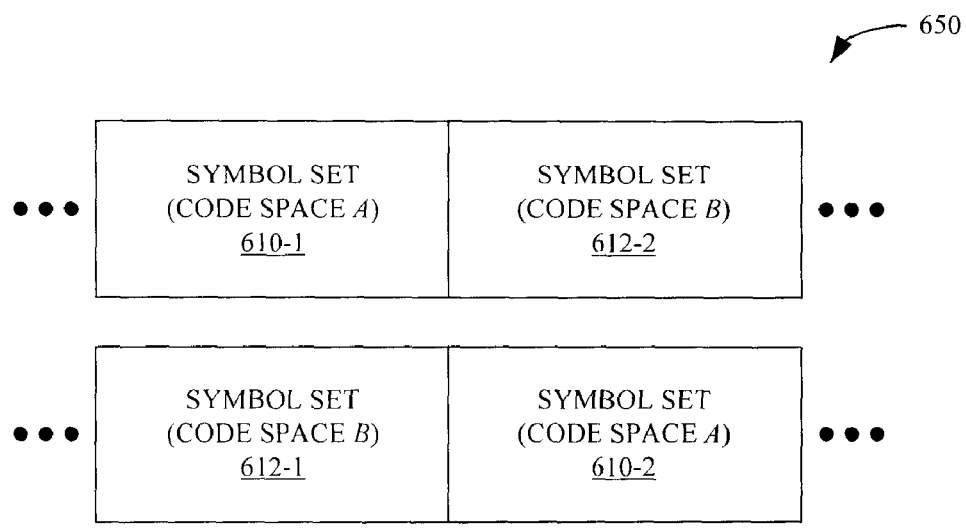
FIG. 6B is a block diagram illustrating alternating coding by pairs of encoders in accordance with one embodiment.

Another approach to alternating encoding is shown in FIG. 6B, which presents a block diagram 650 illustrating alternating coding by a pair of encoders. In this embodiment, the alternating encoding is performed both in parallel and in series. For example, during the first time interval, a first instance of an encoder uses the first codespace (codespace A) to encode symbol set 610-1 and a second instance of an encoder uses the second codespace (codespace B) to encode symbol set 612-1. Then, during the second time interval, the first instance of the encoder uses the second codespace to encode symbol set 612-2 and the second instance of the encoder uses the first codespace to encode symbol set 610-2. In this embodiment, an equal number of 0s and 1s occur in each time interval (when the two parallel codewords provided by the two instances of the encoder are considered), which eliminates simultaneous switching noise.

Figure 7:
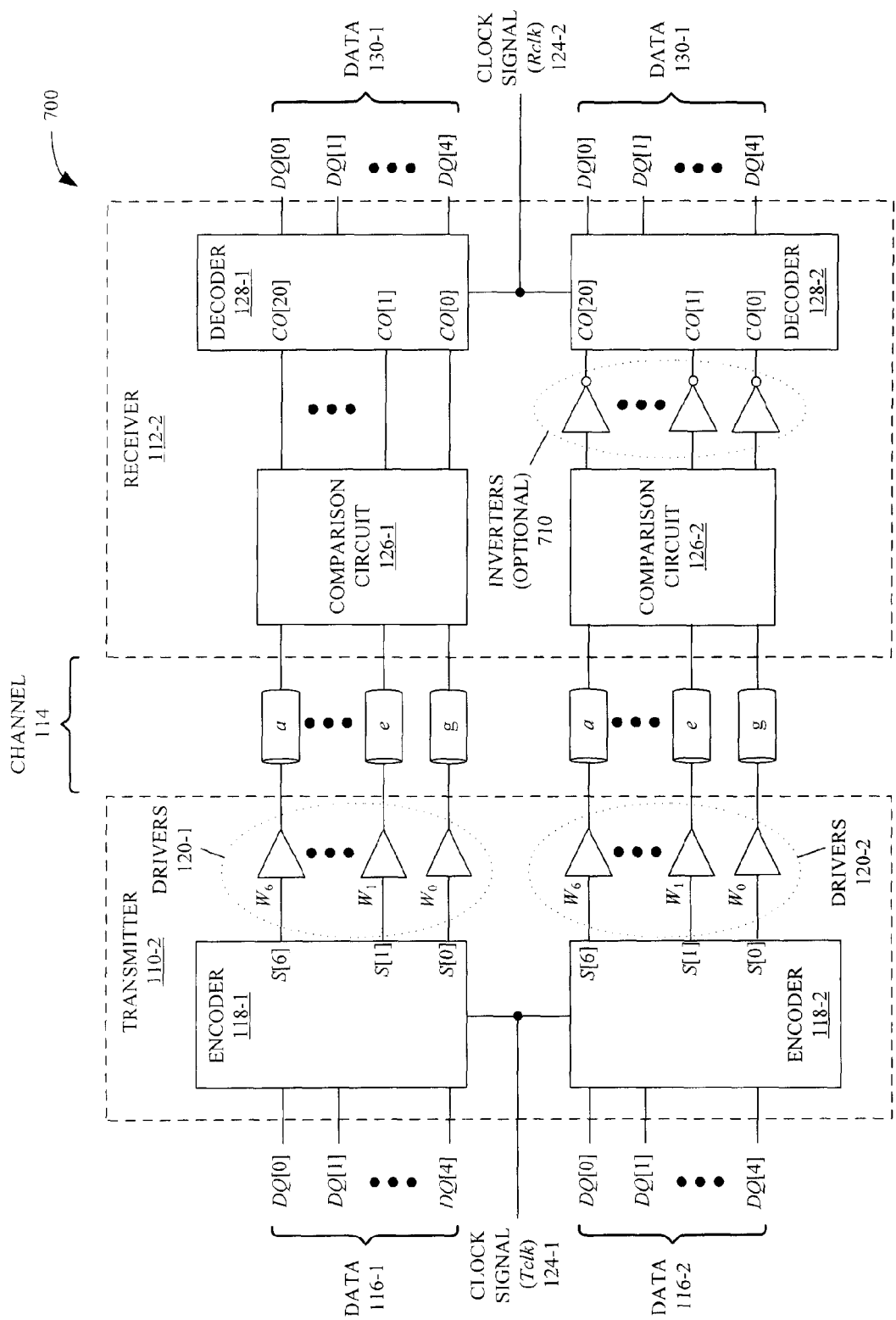
FIG. 7 is a block diagram illustrating a system that encodes and decodes five-bit data DQ[4:0] in accordance with one embodiment.

FIG. 7 presents a block diagram illustrating a system 700 that encodes and decodes five-bit data DQ[4:0] in accordance with another embodiment. System 700 is similar to system 100 of FIG. 1, with like-identified elements being the same or similar in the two, parallel instances of encoders 118, channel 114, comparison circuits 126 and decoders 128. In system 700, symbol sets received on links a-g are decoded using 21 sense amplifier SA output signals CO[20:0]. In other embodiments, system 700 includes mathematical-operation circuit 134-1 (FIG. 1) and fewer sense amplifiers are included in comparison circuits 126.

As shown in FIG. 6B, during a given time interval (such as a half period of clock signal (Tclk) 124-1), encoders 118 may use alternate codespaces to encode data DQ[3:0] 116. Thus, during the first time interval, encoder 118-1 may use codespace A and encoder 118-2 may use codespace B. Similarly, during the second time interval, encoder 118-1 may use codespace B and encoder 118-2 may use codespace A. This alternating encoding may continue for subsequent pairs of time intervals.

However, in other embodiments, encoders 118 use the same codespace (either codespace A or codespace B) is each time interval. Simultaneous switching noise can be eliminated in these embodiments if the codewords in codespace A and codespace B are symbol complements of each other. In this case, decoders 128-1 and 128-2 may use alternating codespaces in these time intervals (for example, during a given time interval, decoder 128-1 may use codespace A and decoder 128-2 may use codespace B), and the symbol complements of signals CO[20:0] are provided to decoder 128-2 during each time interval by optional inverters 710.

Figure 8:
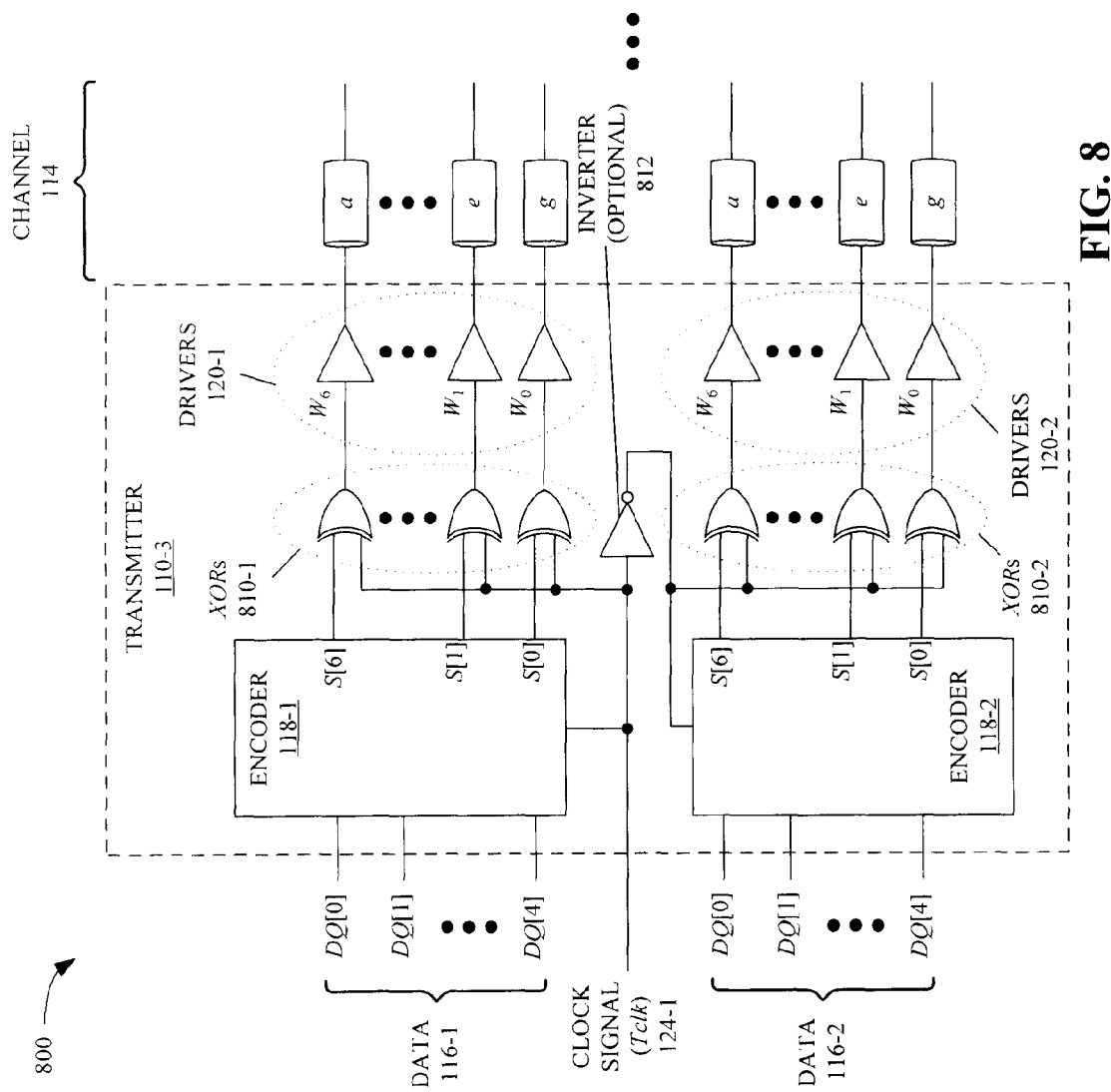
FIG. 8 is a block diagram illustrating transmitter for use in system of FIG. 7 in accordance with one embodiment.

Alternatively, instead of using optional inverters 710, symbol complements may be generated by additional circuits in transmitter 110-2 based on edges in clock signal (Tclk) 124-1. This is shown in FIG. 8, which presents a block diagram 800 illustrating transmitter 110-3 for use in system 700 (FIG. 7). XOR circuits 810 may provide the symbol complements of the symbols output from encoders 118 during alternate, immediately adjacent time intervals. In these embodiments, encoder 118-1 may use codespace A (or codespace B) for each time interval, and encoder 118-2 may use codespace B (or codespace A) for each time interval. However, in other embodiments, the encoders 118 use the same codespace (either codespace A or codespace B) and XOR circuits 810-2 provide symbol complements on alternate time intervals than XOR circuits 810-1 based on the inverse of clock signal (Tclk) 124-1, which is provided by optional inverter 812.

The two instances of the encoder 118, XOR circuits 810 and drivers 120 in FIG. 8 may each operate at half the rate of a system clock. This allows one instance to operate on even data DQ[4:0] 116-1 (during a first half period of the system clock) to provide even codewords, and the other instance to operate on odd data DQ[4:0] 116-2 (during a second half period of the system clock) to provide odd codewords. Therefore, in these embodiments clock signal (Tclk) 124-1 has a period that is twice that of the system clock.

Table 3 illustrates two codespaces, in which each codespace has 3 unbalanced codewords, which have an unequal number of 0s and 1s, and which may be communicated using three links or nodes. These codespaces are symbol compliments of each other and may be used in alternate half periods of clock signal (Tclk) 124-1 (as illustrated in FIGS. 6A and 6B). Symbols on the nodes for each codeword in each codespace can be divided into two sets, a first set of two nodes with symbols that represent the majority symbol type and a second set of one node with symbols that represent the minority symbol type. For each two bits of data DQ[1:0] received, encoder 118-1 (FIG. 1) selects a corresponding codeword from each of the codespaces in Table 3, which are then transmitted on links a-c during adjacent time intervals.

Decoder 128-1 (FIG. 1) can decode the codewords in Table 3 using three sense amplifiers SA to recover the encoded two-bit data DQ[1:0]. Each of the codewords in Table 3 causes one of these sense amplifiers to output the intermediate voltage Vint and the remaining two to output a positive or negative voltage ±Vp.

Figure 9:
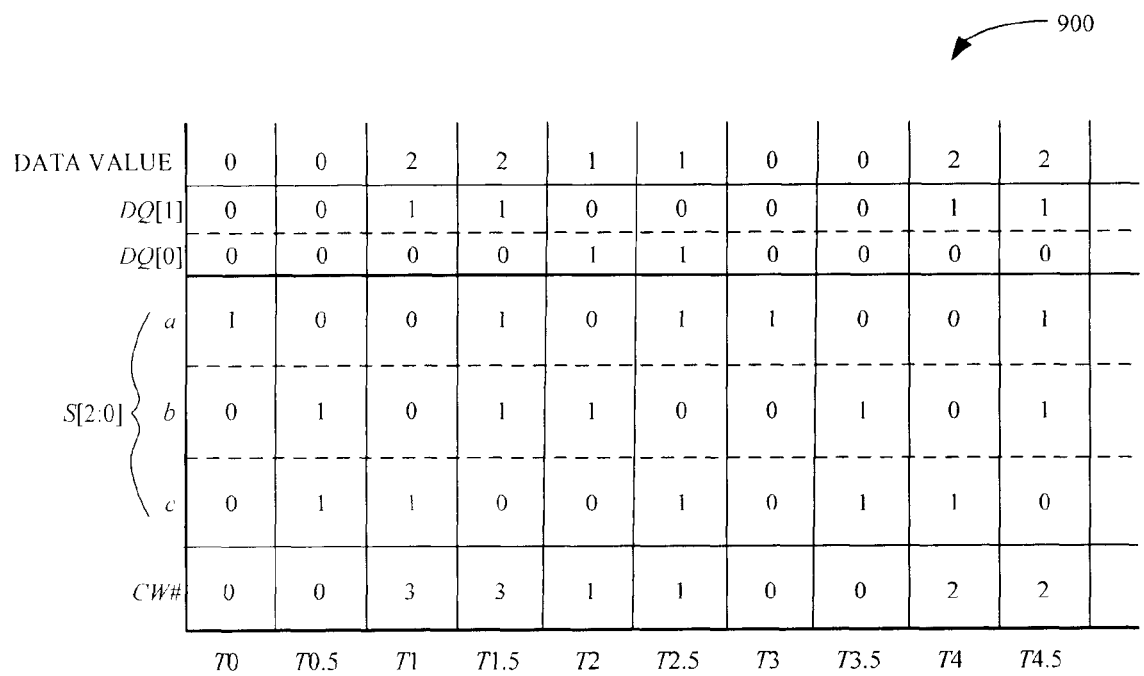
FIG. 9 is a waveform diagram illustrating how an embodiment of encoder of FIG. 1 implements the coding technique of Table 3 to encode a sequence of two-symbol data patterns DQ[1:0] into a series of parallel symbol sets S[2:0] to be conveyed on links a through c.

FIG. 9 presents a waveform diagram 900 illustrating how an embodiment of encoder 118-1 (FIG. 1) implements the coding technique of Table 3 to encode a sequence of two-symbol data patterns DQ[1:0] into a series of parallel symbol sets S[2:0] for transmission across a three-link channel. The encoding technique encodes each codeword in a series of time intervals T0-T4.5 of FIG. 9 using two alternating, symbol-complement codespaces. For example, at time T0, a codespace, in this case the first codespace, is used to encode data DQ[1:0]. In particular, data value 0 (data DQ[1:0]=00) is encoded as codeword 0, which is expressed as symbols S[2:0]=100, and is transmitted. As shown in Table 3, this codeword (as well as the subsequent codewords) can be decoded using sense amplifier outputs SAab, SAbc and SAca. For time T0.5, the second codespace is used to encode data value 0 (data DQ[1:0]=00) as codeword 0, which is expressed as symbols S[2:0]=011, and is transmitted. Each subsequent two-symbol data pattern DQ[1:0] is similarly encoded for time intervals corresponding to half periods of clock signal (Tclk) 124-1. This encoding technique effectively communicates 1.5 data bits (e.g., one of three numbers) on three links during each period of clock signal (Tclk) 124-1.

TABLE 3

| | CDW# | Codeword S[2:0] For Links | | | Comparison Circuit 126-1 Outputs | | |
|---|---|---|---|---|---|---|---|
| | | a | b | c | a − b | b − c | c − a |
| Even | 0 | 1 | 0 | 0 | 1 | x | 0 |
| Half | 1 | 0 | 1 | 0 | 0 | 1 | x |
| Cycles | 2 | 0 | 0 | 1 | x | 0 | 1 |
| Odd | 0 | 0 | 1 | 1 | 0 | x | 1 |
| Half | 1 | 1 | 0 | 1 | 1 | 0 | x |
| Cycles | 2 | 1 | 1 | 0 | x | 1 | 0 |

Table 4 illustrates a codespace with 10 unbalanced codewords, which have an unequal number of 0s and 1s, and which may be communicated using five links or nodes. For each three bits of data DQ[2:0] received, encoder 118-1 (FIG. 1) selects a corresponding codeword from Table 4. This codespace, and its symbol complement, may be used in alternate, immediately adjacent time intervals (as shown in FIGS. 6A and 6B).

Decoder 128-1 (FIG. 1) can decode the codewords in Table 4 using 10 sense amplifiers SA to recover the encoded three-bit data DQ[2:0]. Each of the codewords in Table 4 causes four of these sense amplifiers to output the intermediate voltage Vint and the remaining six to output a positive or negative voltage ±Vp.

Figure 10:
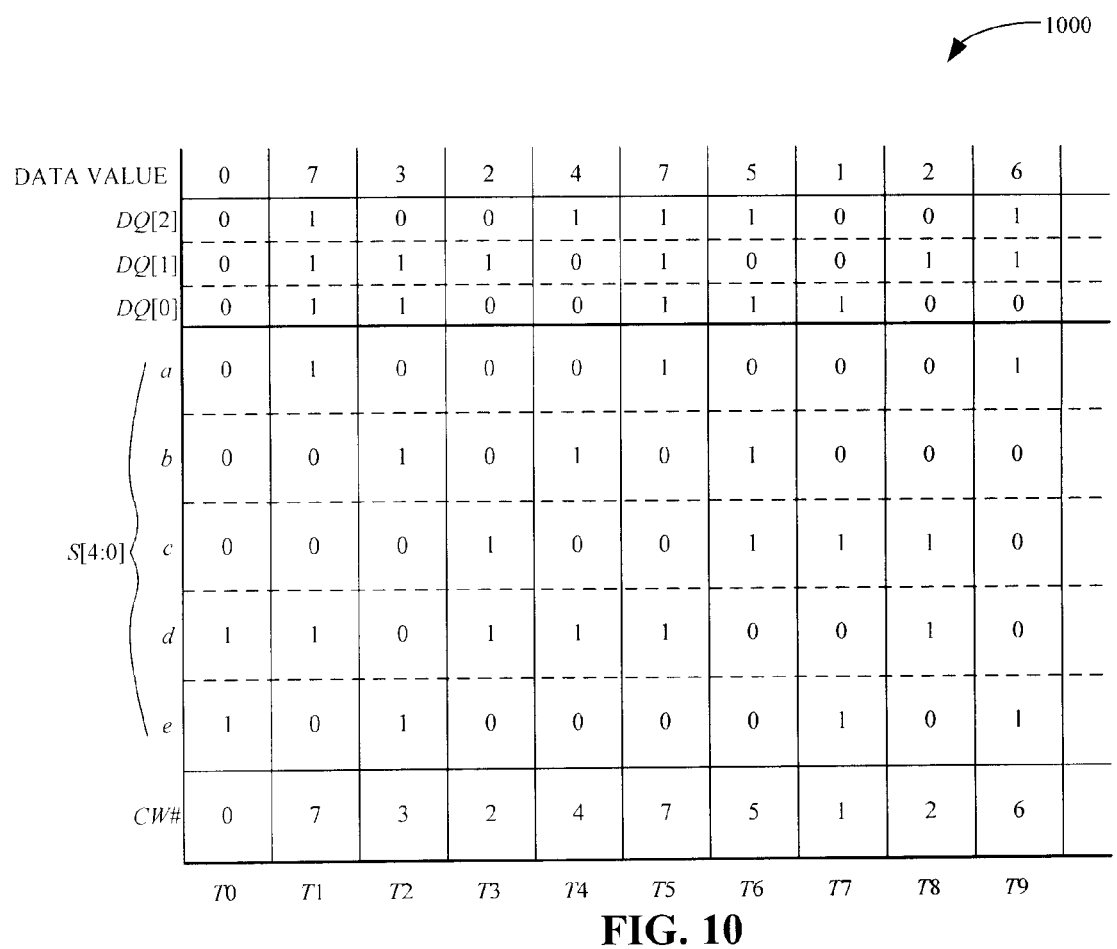
FIG. 10 is a waveform diagram illustrating how an embodiment of pairs of encoders of FIG. 6B implements the coding technique of Table 4 to encode a sequence of three-symbol data patterns DQ[2:0] into a series of parallel symbol sets S[4:0] to be conveyed on links a through e.

FIG. 10 presents a waveform diagram 1000 illustrating how an embodiment of encoder 118-1 (FIG. 1) implements the coding technique of Table 4 to encode a sequence of three-symbol data patterns DQ[2:0] into a series of parallel symbol sets S[4:0] for transmission across a five-link channel. The encoding technique encodes each codeword in a series of time intervals T0-T9 of FIG. 10. For example, at time T0, data value 0 (data DQ[2:0]=000) is encoded as codeword 0, which is expressed as symbols S[4:0]=00011, and is transmitted. As shown in Table 4, this codeword (as well as the subsequent codewords) can be decoded using sense amplifier outputs SAab, SAac, SAad, SAae, SAbc, SAbd, SAbe, SAcd, SAce and Sade. For time T1, data value 7 (data DQ[2:0]=111) is encoded as codeword 7, which is expressed as symbols S[4:0]=10010, and is transmitted. Each subsequent three-symbol data pattern DQ[2:0] is similarly encoded.

TABLE 4

| CDW# | Codeword S[4:0] For Links | | | | | Comparison Circuit 126-1 Outputs | | | | | | | | | |
|---|---|---|---|---|---|---|---|---|---|---|---|---|---|---|---|
| | a | b | c | d | e | a − b | a − c | a − d | a − e | b − c | b − d | b − e | c − d | c − e | d − e |
| 0 | 0 | 0 | 0 | 1 | 1 | x | x | 0 | 0 | x | 0 | 0 | 0 | 0 | x |
| 1 | 0 | 0 | 1 | 0 | 1 | x | 0 | x | 0 | 0 | x | 0 | 1 | x | 0 |
| 2 | 0 | 0 | 1 | 1 | 0 | x | 0 | 0 | x | 0 | 0 | x | x | 1 | 1 |

TABLE 4-continued

| | Codeword S[4:0] For Links | | | | | Comparison Circuit 126-1 Outputs | | | | | | | | | |
|---|---|---|---|---|---|---|---|---|---|---|---|---|---|---|---|
| CDW# | a | b | c | d | e | a-b | a-c | a-d | a-e | b-c | b-d | b-e | c-d | c-e | d-e |
| 3 | 0 | 1 | 0 | 0 | 1 | 0 | x | x | 0 | 1 | 1 | x | x | 0 | 0 |
| 4 | 0 | 1 | 0 | 1 | 0 | 0 | x | 0 | x | 1 | x | 1 | 0 | x | 1 |
| 5 | 0 | 1 | 1 | 0 | 0 | 0 | 0 | x | x | x | 1 | 1 | 1 | 1 | x |
| 6 | 1 | 0 | 0 | 0 | 1 | 1 | 1 | 1 | x | x | x | 0 | x | 0 | 0 |
| 7 | 1 | 0 | 0 | 1 | 0 | 1 | 1 | x | 1 | x | 0 | x | 0 | x | 1 |
| 8 | 1 | 0 | 1 | 0 | 0 | 1 | x | 1 | 1 | 0 | x | x | 1 | 1 | x |
| 9 | 1 | 1 | 0 | 0 | 0 | x | 1 | 1 | 1 | 1 | 1 | 1 | x | x | x |

Table 5 illustrates a codespace with 35 unbalanced codewords, which have an unequal number of 0s and 1s, and which may be communicated using seven links or nodes. For each five bits of data DQ[4:0] received, encoder 118-1 (FIG. 1) selects a corresponding codeword from Table 5. This codespace, and its symbol complement, may be used in alternate, immediately adjacent time intervals (as shown in FIGS. 6A and 6B).

Decoder 128-1 (FIG. 1) can decode the codewords in Table 5 using 21 sense amplifiers SA to recover the encoded five-bit data DQ[4:0]. Each of the codewords in Table 5 causes nine of these sense amplifiers to output the intermediate voltage Vint and the remaining twelve to output a positive or negative voltage ±Vp.

Figure 11:
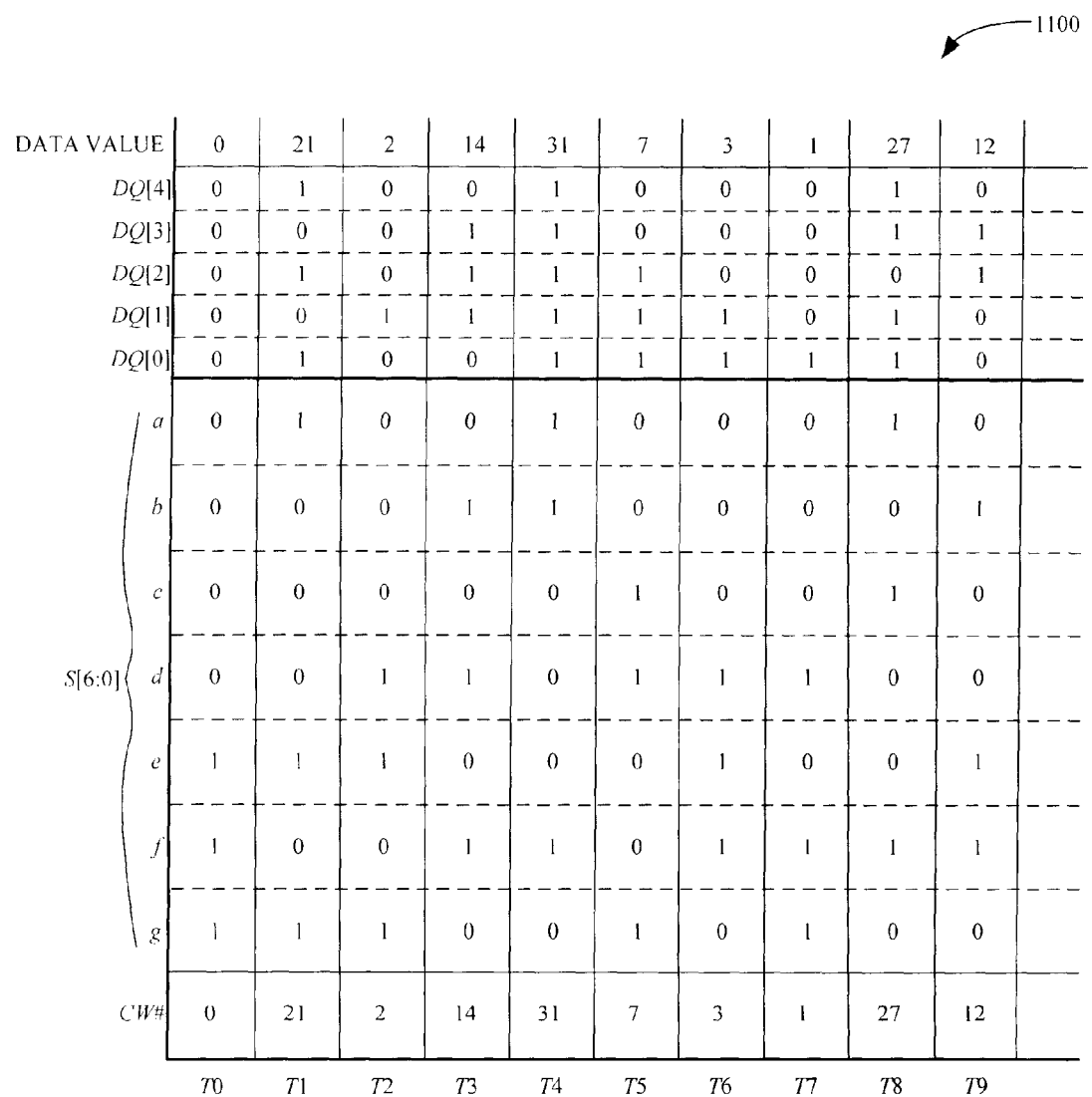
FIG. 11 is a waveform diagram illustrating how an embodiment of pairs of encoders of FIG. 6B implements the coding technique of Table 5 to encode a sequence of five-symbol data patterns DQ[4:0] into a series of parallel symbol sets S[6:0] to be conveyed on links a through g.

FIG. 11 presents a waveform diagram 1100 illustrating how an embodiment of encoder 118-1 (FIG. 1) implements the coding technique of Table 5 to encode a sequence of five-symbol data patterns DQ[4:0] into a series of parallel symbol sets S[6:0] for transmission across a seven-link channel. The encoding technique encodes each codeword in a series of time intervals T0-T9 of FIG. 11. For example, at time T0, data value 0 (data DQ[4:0]=0000) is encoded as codeword 0, which is expressed as symbols S[6:0]=0000111, and is transmitted. As shown in Table 5, this codeword (as well as the subsequent codewords) can be decoded using sense amplifier outputs SAab, SAac, SAad, SAae, SAaf, SAag, SAbc, SAbd, SAbe, SAbf, SAbg, SAcd, SAce, SAcf, SAcg, SAde, SAdf, Sadg, SAef, SAeg and SAfg. For time T1, data value 21 (data DQ[4:0]=10101) is encoded as codeword 21, which is expressed as symbols S[6:0]=1000101, and is transmitted. Each subsequent five-symbol data pattern DQ[4:0] is similarly encoded.

TABLE 5

| | Codeword S[6:0] For Links | | | | | | | Comparison Circuit 126-1 Outputs | | | | | | | | | | | | | | | | | | | | |
|---|---|---|---|---|---|---|---|---|---|---|---|---|---|---|---|---|---|---|---|---|---|---|---|---|---|---|---|---|
| CDW# | a | b | c | d | e | f | g | ab | ac | ad | ae | af | ag | bc | bd | be | bf | bg | cd | ce | cf | cg | de | df | dg | ef | eg | fg |
| 0 | 0 | 0 | 0 | 0 | 1 | 1 | 1 | x | x | x | 0 | 0 | 0 | x | x | 0 | 0 | 0 | x | 0 | 0 | 0 | 0 | 0 | 0 | x | x | x |
| 1 | 0 | 0 | 0 | 1 | 0 | 1 | 1 | x | x | 0 | x | 0 | 0 | x | 0 | x | 0 | 0 | 0 | x | 0 | 0 | 1 | 0 | 0 | 0 | 0 | x |
| 2 | 0 | 0 | 0 | 1 | 1 | 0 | 1 | x | x | 0 | 0 | x | 0 | x | 0 | 0 | x | 0 | 0 | 0 | x | 0 | x | 1 | 0 | 1 | 0 | 0 |
| 3 | 0 | 0 | 0 | 1 | 1 | 1 | 0 | x | x | 0 | 0 | 0 | x | x | 0 | 0 | 0 | x | 0 | 0 | 0 | x | x | x | 1 | x | 1 | 1 |
| 4 | 0 | 0 | 1 | 0 | 0 | 1 | 1 | x | 0 | x | x | 0 | 0 | 0 | x | x | 0 | 0 | 1 | 1 | x | x | x | 0 | 0 | 0 | 0 | x |
| 5 | 0 | 0 | 1 | 0 | 1 | 0 | 1 | x | 0 | x | 0 | x | 0 | 0 | x | 0 | x | 0 | 1 | x | 1 | x | 0 | x | 0 | 1 | x | 0 |
| 6 | 0 | 0 | 1 | 0 | 1 | 1 | 0 | x | 0 | x | 0 | 0 | x | 0 | x | 0 | 0 | x | 1 | x | x | 1 | 0 | 0 | x | x | 1 | 1 |
| 7 | 0 | 0 | 1 | 1 | 0 | 0 | 1 | x | 0 | 0 | x | x | 0 | 0 | 0 | x | x | 0 | x | 1 | 1 | x | 1 | 1 | x | x | 0 | 0 |
| 8 | 0 | 0 | 1 | 1 | 0 | 1 | 0 | x | 0 | 0 | x | 0 | x | 0 | 0 | x | 0 | x | x | 1 | x | 1 | 1 | x | 1 | 0 | x | 1 |
| 9 | 0 | 0 | 1 | 1 | 1 | 0 | 0 | x | 0 | 0 | 0 | x | x | 0 | 0 | 0 | x | x | x | x | 1 | 1 | x | 1 | 1 | 1 | 1 | x |
| 10 | 0 | 1 | 0 | 0 | 0 | 1 | 1 | 0 | x | x | x | 0 | 0 | 1 | 1 | 1 | x | x | x | x | 0 | 0 | x | 0 | 0 | 0 | 0 | x |
| 11 | 0 | 1 | 0 | 0 | 1 | 0 | 1 | 0 | x | x | 0 | x | 0 | 1 | 1 | x | 1 | x | x | 0 | x | 0 | 0 | x | 0 | 1 | x | 0 |
| 12 | 0 | 1 | 0 | 0 | 1 | 1 | 0 | 0 | x | x | 0 | 0 | x | 1 | 1 | x | x | 1 | x | 0 | 0 | x | 0 | 0 | x | x | 1 | 1 |
| 13 | 0 | 1 | 0 | 1 | 0 | 0 | 1 | 0 | x | 0 | x | x | 0 | 1 | x | 1 | 1 | x | 0 | x | x | 0 | 1 | 1 | x | x | 0 | 0 |
| 14 | 0 | 1 | 0 | 1 | 0 | 1 | 0 | 0 | x | 0 | x | 0 | x | 1 | x | 1 | x | 1 | 0 | x | 0 | x | 1 | x | 1 | 0 | x | 1 |
| 15 | 0 | 1 | 0 | 1 | 1 | 0 | 0 | 0 | x | 0 | 0 | x | x | 1 | x | x | 1 | 1 | 0 | 0 | x | x | x | 1 | 1 | 1 | 1 | x |
| 16 | 0 | 1 | 1 | 0 | 0 | 0 | 1 | 0 | 0 | x | x | x | 0 | x | 1 | 1 | 1 | x | 1 | 1 | 1 | x | x | x | 0 | x | 0 | 0 |
| 17 | 0 | 1 | 1 | 0 | 0 | 1 | 0 | 0 | 0 | x | x | 0 | x | x | 1 | 1 | x | 1 | 1 | 1 | x | 1 | x | 0 | x | 0 | x | 1 |
| 18 | 0 | 1 | 1 | 0 | 1 | 0 | 0 | 0 | 0 | x | 0 | x | x | x | 1 | x | 1 | 1 | 1 | x | 1 | 1 | 0 | x | x | 1 | 1 | x |
| 19 | 0 | 1 | 1 | 1 | 0 | 0 | 0 | 0 | 0 | 0 | x | x | x | x | x | 1 | 1 | 1 | x | 1 | 1 | 1 | 1 | 1 | 1 | x | x | x |
| 20 | 1 | 0 | 0 | 0 | 0 | 1 | 1 | 1 | 1 | 1 | 1 | x | x | x | x | x | 0 | 0 | x | x | 0 | 0 | x | 0 | 0 | 0 | 0 | x |
| 21 | 1 | 0 | 0 | 0 | 1 | 0 | 1 | 1 | 1 | 1 | x | 1 | x | x | x | 0 | x | 0 | x | 0 | x | 0 | 1 | x | 0 | 1 | x | 0 |
| 22 | 1 | 0 | 0 | 0 | 1 | 1 | 0 | 1 | 1 | 1 | x | x | 1 | x | x | 0 | 0 | x | x | 0 | 0 | x | 1 | 1 | x | x | 1 | 1 |
| 23 | 1 | 0 | 0 | 1 | 0 | 0 | 1 | 1 | 1 | x | 1 | 1 | x | x | 0 | x | x | 0 | 0 | x | x | 0 | 1 | 1 | x | x | 0 | 0 |
| 24 | 1 | 0 | 0 | 1 | 0 | 1 | 0 | 1 | 1 | x | 1 | x | 1 | x | 0 | x | 0 | x | 0 | x | 0 | x | 1 | x | 1 | 0 | x | 1 |
| 25 | 1 | 0 | 0 | 1 | 1 | 0 | 0 | 1 | 1 | x | x | 1 | 1 | x | 0 | 0 | x | x | 0 | 0 | x | x | x | 1 | 1 | 1 | 1 | x |
| 26 | 1 | 0 | 1 | 0 | 0 | 0 | 1 | 1 | x | 1 | 1 | 1 | x | 0 | x | x | x | 0 | 1 | 1 | 1 | x | x | x | 0 | x | 0 | 0 |
| 27 | 1 | 0 | 1 | 0 | 0 | 1 | 0 | 1 | x | 1 | 1 | x | 1 | 0 | x | x | 0 | x | 1 | 1 | x | 1 | x | 0 | x | 0 | x | 1 |
| 28 | 1 | 0 | 1 | 0 | 1 | 0 | 0 | 1 | x | 1 | x | 1 | 1 | 0 | x | 0 | x | x | 1 | x | 1 | 1 | 0 | x | x | 1 | 1 | x |
| 29 | 1 | 0 | 1 | 1 | 0 | 0 | 0 | 1 | x | x | 1 | 1 | 1 | 0 | 0 | x | x | x | x | 1 | 1 | 1 | 1 | 1 | 1 | x | x | x |
| 30 | 1 | 1 | 0 | 0 | 0 | 0 | 1 | x | 1 | 1 | 1 | 1 | x | 1 | 1 | 1 | 1 | x | x | x | x | 0 | x | x | 0 | x | 0 | 0 |
| 31 | 1 | 1 | 0 | 0 | 0 | 1 | 0 | x | 1 | 1 | 1 | x | 1 | 1 | 1 | 1 | x | 1 | x | x | 0 | x | x | 0 | x | 0 | x | 1 |
| 32 | 1 | 1 | 0 | 0 | 1 | 0 | 0 | x | 1 | 1 | x | 1 | 1 | 1 | 1 | x | 1 | 1 | x | 0 | x | x | 0 | x | x | 1 | 1 | x |

TABLE 5-continued

| | Codeword S[6:0] For Links | | | | | | | Comparison Circuit 126-1 Outputs | | | | | | | | | | | | | | | | | | | | |
|---|---|---|---|---|---|---|---|---|---|---|---|---|---|---|---|---|---|---|---|---|---|---|---|---|---|---|---|---|
| CDW# | a | b | c | d | e | f | g | ab | ac | ad | ae | af | ag | bc | bd | be | bf | bg | cd | ce | cf | cg | de | df | dg | ef | eg | fg |
| 33 | 1 | 1 | 0 | 1 | 0 | 0 | 0 | x | 1 | x | 1 | 1 | 1 | 1 | x | 1 | 1 | 1 | 0 | x | x | x | 1 | 1 | 1 | x | x | x |
| 34 | 1 | 1 | 1 | 0 | 0 | 0 | 0 | x | x | 1 | 1 | 1 | 1 | x | 1 | 1 | 1 | 1 | 1 | 1 | 1 | 1 | x | x | x | x | x | x |

While Table 4 illustrates a codespace with codewords that include an odd number of 0s and an even number of 1s, and Table 5 illustrates a codespace with codewords that include an even number of 0s and an odd number of 1s, in other embodiments these codespaces may include codewords that are the complement of the codewords in Tables 4 and 5.

Figure 12:
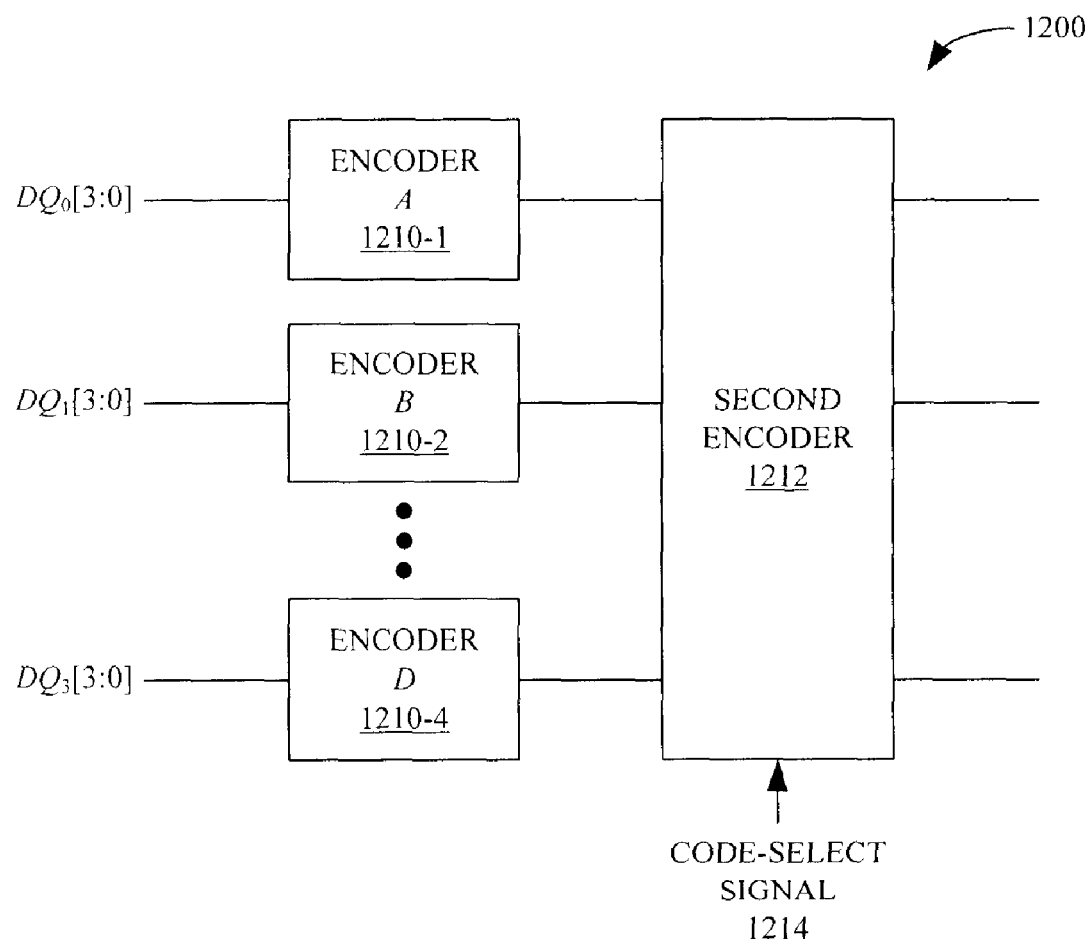
FIG. 12 is a block diagram illustrating cascaded encoders in accordance with one embodiment.

The foregoing embodiments of the encoding technique can also be used to provide cascaded or composite codes. FIG. 12 presents a block diagram 1200 illustrating cascaded encoders in accordance with another embodiment. First, sets of data $DQ_i[3:0]$ are encoded by encoders 1210. The codewords output from these encoders are then encoded by second encoder 1212, which can be configured by code-select signal 1214. For example, code-select signal 1214 may select a codespace that is used by second encoder 1212. Encoders 1210 may output codewords that include symbols which are the symbol complement of the symbols in the codewords output by second encoder 1212. Therefore, the combined effect of encoders 1210 and second encoder 1212 may provide effective codewords that are balanced and which include an even number of symbols.

Cascaded encoding may be used to implement a variety of codes, including: a 3-6 encoding technique (in which three-bit data DQ[2:0] is encoded using six-symbol codewords), an approximately 5-8 encoding technique, a 6-10 encoding technique, a 7-10 encoding technique, a 8-12 encoding technique, a 10-14 encoding technique, a 11-15 encoding technique or a 15-20 encoding technique. For example, 3-6 encoding technique may be implemented by concatenating two instances of a 1.5-3 encoding technique (Table 3) using a first codespace in encoders 1210 and a second symbol-complement codespace in second encoder 1212. In other cascaded encoding embodiments, encoders 1210 and second encoder 1212, respectively, may implement: a 1.5-3 encoding technique (such as one of the codes shown in Table 3) and a 3-5 encoding technique (Table 4) to provide a 5-8 encoding technique; two symbol-complement 3-5 encoding techniques (such as the code shown in Table 4) to provide a 6-10 encoding technique; a 3-5 encoding technique (Table 4) and a 5-7 encoding technique (Table 5) to provide a 8-12 encoding technique; and two symbol-complement 5-7 encoding techniques (such as the code shown in Table 5) to provide a 10-14 encoding technique.

While the foregoing embodiments illustrate comparison circuits 126 (FIGS. 1 and 7) with differential sense amplifiers, these and other embodiments may also use single-ended amplifiers. Moreover, symbols in the codewords on different nodes or links may not have equal weights or symbol types. For example, as shown in FIGS. 7 and 8, each of drivers 120 may apply a weight $W_i$ to the symbol on the corresponding node.

In addition to assisting with the decoding of received symbol sets CO[5:0] (FIG. 1), the additional information provided by the output from mathematical-operation circuit 134-1 (FIG. 1) can be used to identify errors, to correct errors, or both. For example, in embodiments where the group of codewords is expected to alternate for immediately adjacent time intervals, the occurrence of one or more errors may be indicated by a failure of the mathematical-operation output to change between these time intervals. Alternatively or additionally, a non-allowed value of the mathematical operation output may occur. Mathematical-operation circuit 134-1 (FIG. 1) may perform a wide variety of operations on the symbols received on the links, including: arithmetic operations, logical or Boolean operations, nonlinear operations (such as transformations), or combinations of one or more of these operations.

The foregoing embodiments employ the outputs from sense amplifiers to decode data. Other embodiments decode data by considering additional sense-amplifier outputs. For example, the decoder can sample all available sense-amplifier outputs over a number of time intervals and apply the resulting samples to a trellis to determine the most probable data sequence. Viterbi decoding is one well-known algorithm for finding a most probable trellis-encoded data sequence. Alternatively, the decoders 128 (FIGS. 1 and 7) may be implemented as finite state machines.

Figure 13:
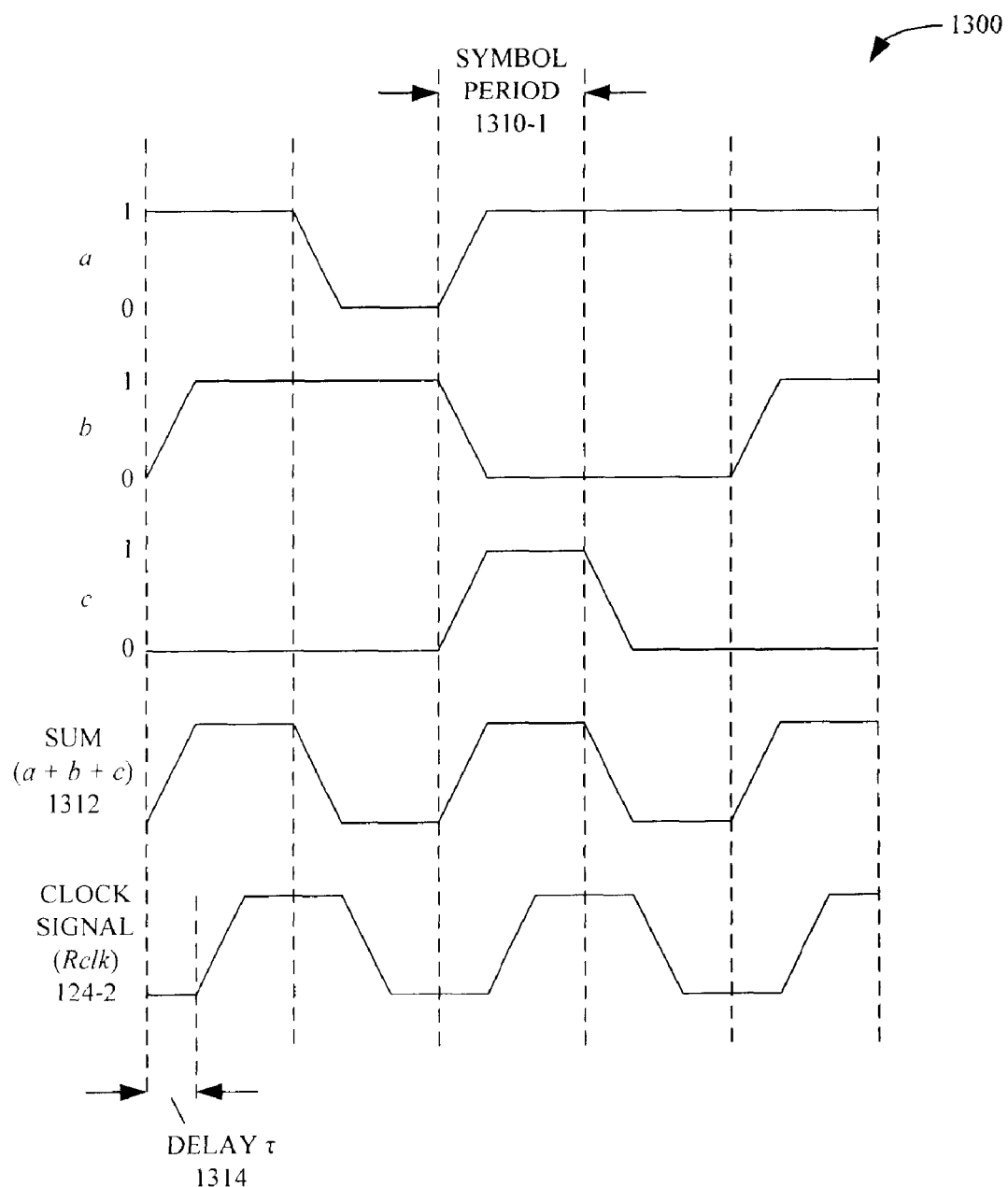
FIG. 13 is a waveform diagram illustrating the recovery of an embedded clock signal in accordance with one embodiment.

In the foregoing embodiments, clock signal (Rclk) 124-2 (FIGS. 1 and 7) can be provided using a clock-forwarding link. Alternatively, for codewords with an odd number of symbols, it may be recovered from the symbols transmitted on the links using embedded clock recovery. This is illustrated in FIG. 13, which presents a waveform diagram 1300 illustrating the recovery of an embedded clock signal (Rclk) 124-2 in accordance with another embodiment. In this waveform diagram, vertical dashed lines indicate sampling times and adjacent pairs of vertical dashed lines denote a symbol period, such as symbol period 1310-1. During each symbol period, the three symbols on links a-c are associated with a codeword. If symbol-complement codespaces are used to encode the codewords in adjacent symbol periods (or time intervals), sum 1312 of the symbols on links a-c changes sign in each symbol period. (Alternatively, the average of the symbols in each symbol period may be used.) Clock signal (Rclk) 124-2 may be recovered by delaying (by delay $\tau$1314) the summation signal. This combination is approximately independent of intersymbol interference on links a-c. Jitter in recovered clock signal (Rclk) 124-2 is determined by transmitters 110 (FIGS. 1, 7 and 8).

Figure 14:
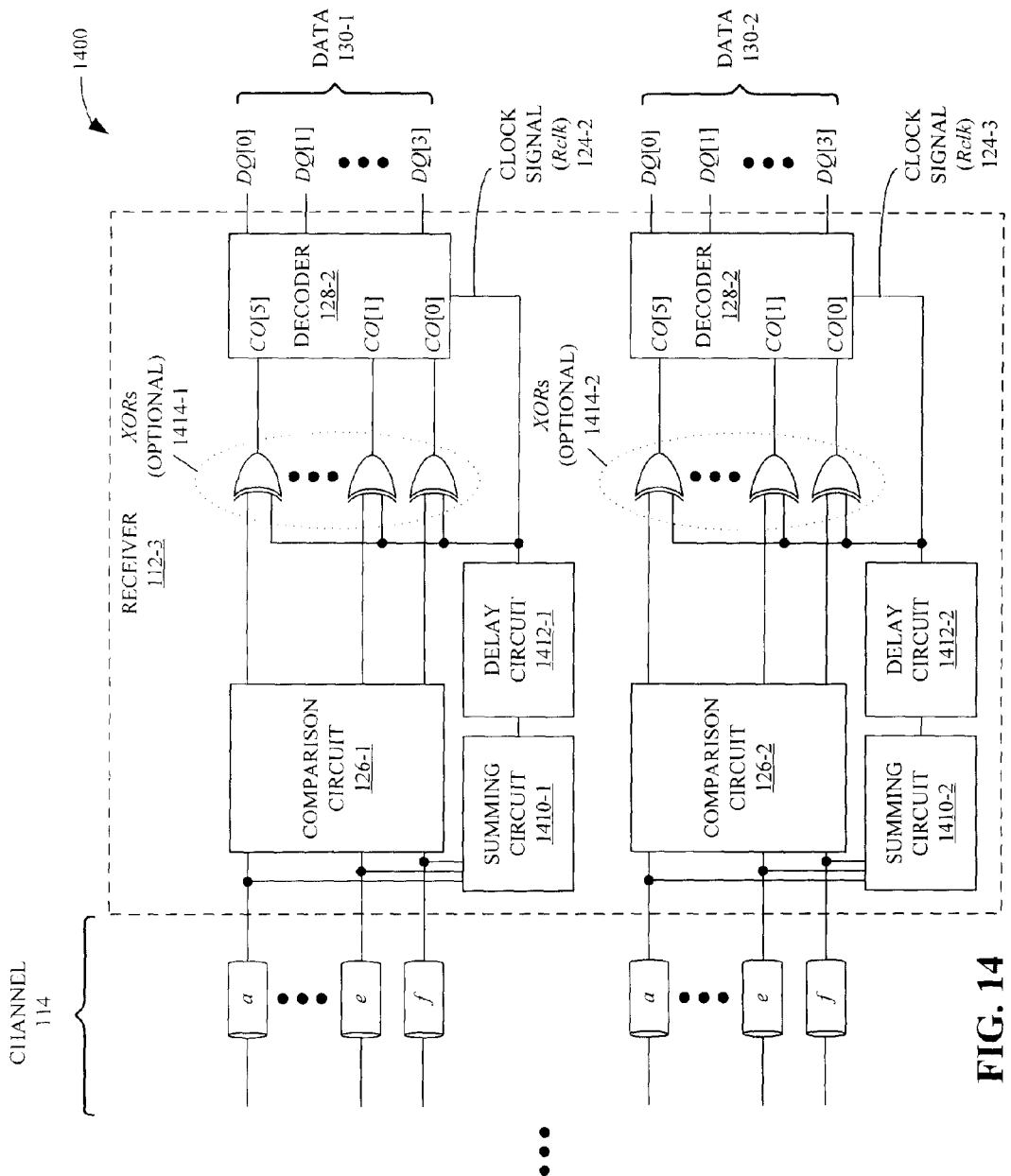
FIG. 14 is a block diagram illustrating a receiver for use in system of FIG. 7 in accordance with one embodiment.

FIG. 14 presents a block diagram 1400 illustrating receiver 112-3 for use in system 700 (FIG. 7) in accordance with another embodiment. Clock signals (Rclk) 124 may be recovered on either or both instances of channel 114, comparison circuits 126 and decoders 128. In particular, summing circuits 1410 may sum the symbols on links a-f. A given sum may have a positive (or even) value during a current time interval and a negative (or odd) value during the immediately following time interval. As shown in FIG. 13, after recovery, clock signals (Rclk) 124 may be conditioned. For example, clock signals (Rclk) 124 may be filtered (using a low-pass filter or an integrator). In addition, delay circuits 1412 may correct for skew, duty-cycle or both. In some embodiments, optional XOR circuits 1412 are used to provide symbol complements based on the resulting clock signals (Rclk) 124.

If each instance of a receive path (links, comparison circuit and decoder) separately recovers a local clock signal from the received codewords, it may not be necessary to match the lengths of the links in the different instances. Moreover, if these instances share a common clock signal (Rclk), the instances may operate at lower data rates. For example, two instances in receiver 112-3 may each operate at half the rate of a system clock (e.g., using double date rate), thereby allowing one instance to operate on even codewords and even data (e.g., data in a first half period), and the other instance to operate on odd codewords and odd data (e.g., data in a second half period). Consequently, in these embodiments clock signal (Rclk) may have a period that is twice that of the system clock.

In the foregoing description and in the accompanying drawings, specific terminology and drawing symbols are set forth to provide a thorough understanding of the present invention. In some instances, the terminology and symbols may imply specific details that are not required to practice the invention. For example, embodiments of the invention may be adapted for use with multi-pulse-amplitude-encoded (multi-PAM) signals.

An output of a process for designing an integrated circuit, or a portion of an integrated circuit, comprising one or more of the circuits described herein may be a computer-readable medium such as, for example, a magnetic tape, or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer-readable medium. Those of skill in the art of integrated circuit fabrication can use such encoded data to fabricate integrated circuits comprising one or more of the circuits described herein.

While the present invention has been described in connection with specific embodiments, the claims are not limited to what is shown. For example, the foregoing embodiments depict a 4-6 encoding technique (Table 1), a 6-8 encoding technique (Table 2), a 1.5-3 encoding technique (Table 3), a 3-5 encoding technique (Table 4) and a 5-7 encoding technique (Table 5). More generally, embodiments can support N-to-M encoding, where M is greater than N, is at least one and is even or odd. For example, N may be 1 and M may be 3 or N may be 7 and M may be 9.

The N-symbol data can be represented using all or a subset of possible N-symbol values. Furthermore, the embodiments detailed above can be replicated and/or combined to support different input data widths (e.g., two 4-10 encoders can be logically combined to convey eight-bit data over twenty links). Moreover, some components are shown directly connected to one another while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art. For example, some of the foregoing codespaces provide balanced signaling, and support AC-coupled links. Other embodiments can be unbalanced, include DC-coupled links, or both. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A receiver circuit, comprising:
   input nodes to receive a set of symbols representing a first codeword in a first codegroup;
   a first circuit to determine a first decoder value based on the set of symbols, the first decoder value identifying the first codegroup;
   a second circuit to determine a second decoder value based on the set of symbols, the second decoder value identifying the first codeword in the first codegroup; and
   a decoder circuit to determine a data word corresponding to the first codeword in the first codegroup based on the first decoder value and the second decoder value.

2. The receiver circuit of claim 1,
   wherein the first circuit determines the first decoder value by determining a difference between a first sum and a second sum, wherein the first sum is a sum of symbols in a first subset of the set of symbols, and wherein the second sum is a sum of symbols in a second subset of the set of symbols; and
   wherein the second circuit determines the second decoder value by:
      determining first comparison results for pairs of symbols in the first subset of the set of symbols; and
      determining second comparison results for pairs of symbols in the second subset of the set of symbols.

3. The receiver circuit of claim 2, wherein the second circuit includes a set of sense amplifiers, wherein each sense amplifier outputs a comparison result corresponding to a difference between two symbols.

4. The receiver circuit of claim 3, wherein there are M symbols in the set of symbols, and wherein there are fewer than $M(M-1)/2$ sense amplifiers.

5. The receiver circuit of claim 3, wherein there are M symbols in the set of symbols, and wherein there are $(M/2)((M/2)-1)$ sense amplifiers.

6. The receiver circuit of claim 1, wherein the decoder circuit uses time interval information associated with the set of symbols to determine the data word.

7. The receiver circuit of claim 6, wherein different codespaces are used in different time intervals.

8. The receiver circuit of claim 6, wherein codewords in adjacent time intervals associated with the data word are complements of each other.

9. The receiver circuit of claim 8, further comprising a symbol-complement circuit that provides the complement of the set of symbols to the decoder circuit.

10. The receiver circuit of claim 6, further comprising a clock-recovery circuit to recover a clock signal embedded in codewords received over a series of time intervals at the input nodes.

11. The receiver circuit of claim 10, wherein the clock recovery circuit sums the symbols in each codeword.

12. The receiver circuit of claim 6,
    wherein a first portion of the receiver circuit determines data words during even time intervals and a second portion of the receiver circuit determines data words during odd time intervals; and
    wherein the first portion of the receiver circuit and the second portion of the receiver circuit operate at half the rate of the clock signal.

13. The receiver circuit of claim 1, wherein the set of symbols is balanced.

14. An integrated circuit, comprising:
means for receiving a set of symbols representing a first codeword in a first codegroup;
means for determining a first decoder value based on the set of symbols, the first decoder value identifying the first codegroup;
means for determining a second decoder value based on the set of symbols, the second decoder value identifying the first codeword in the first codegroup; and
means for determining a data word corresponding to the first codeword in the first codegroup based on the first decoder value and the second decoder value.

15. A system, comprising:
a transmitter to encode a data word into a set of symbols, the set of symbols representing a first codeword in a first codegroup; and
a receiver coupled to the transmitter, wherein the receiver includes:
input nodes to receive the set of symbols;
a first circuit to determine a first decoder value based on the set of symbols, the first decoder value identifying the first codegroup;
a second circuit to determine a second decoder value based on the set of symbols, the second decoder value identifying the first codeword in the first codegroup; and
a decoder circuit to determine the data word based on the first decoder value and the second decoder value.

16. The system of claim 15,
wherein the first circuit determines the first decoder value by determining a difference between a first sum and a second sum, wherein the first sum is a sum of symbols in a first subset of the set of symbols, and wherein the second sum is a sum of symbols in a second subset of the set of symbols; and
wherein the second circuit determines the second decoder value by:
determining first comparison results for pairs of symbols in the first subset of the set of symbols; and
determining second comparison results for pairs of symbols in the second subset of the set of symbols.

17. The system of claim 16, wherein the second circuit includes a set of sense amplifiers, wherein each sense amplifier outputs a comparison result corresponding to a difference between two symbols.

18. The system of claim 15, wherein different codespaces are used in different time intervals.

19. The system of claim 18, wherein codewords in adjacent time intervals associated with the data word are complements of each other.

20. A method for decoding a codeword, the method comprising:
receiving a set of symbols representing a first codeword in a first codegroup in a first codespace, wherein different codespaces are used in different time intervals;
outputting a first decoder value based on the set of symbols, the first decoder value identifying the first codegroup;
outputting a second decoder value based on the set of symbols, the second decoder value identifying the first codeword in the first codegroup; and
determining a data word corresponding to the first codeword in the first codegroup based on the first decoder value, the second decoder value, and time interval information associated with the set of symbols.

21. The method of claim 20, wherein codewords in adjacent time intervals associated with the data word are complements of each other.

22. A method for encoding a data word, the method comprising:
receiving the data word; and
selecting an M-symbol codeword based on the data word, wherein the M-symbol codeword is capable of being decoded using less than $M(M-1)/2$ difference values, wherein each difference value corresponds to a difference between two symbols in the M-symbol codeword.

23. The method of claim 22, wherein different codespaces are used in different time intervals, and wherein selecting the M-symbol codeword includes:
selecting a codespace based at least on time interval information; and
selecting the M-symbol codeword from the selected codespace.

24. The method of claim 23, wherein codewords in adjacent time intervals associated with the data word are complements of each other.

25. The method of claim 22, wherein the M-symbol codeword is capable of being decoded using $(M/2)((M/2)-1)$ difference values.

26. A transmitter circuit, comprising:
an encoder configured to encode a data word into an M-symbol codeword capable of being decoded using less than $M(M-1)/2$ difference values, each difference value corresponding to a difference between two symbols in the M-symbol codeword; and
a set of drivers, each driver in the set of drivers configured to output a symbol in the M-symbol codeword onto a transmission link.

27. The transmitter circuit of claim 26, wherein the M-symbol codeword is capable of being decoded using $(M/2)((M/2)-1)$ difference values.

28. An integrated circuit, comprising:
means for receiving a data word; and
means for encoding the data word into an M-symbol codeword capable of being decoded using $(M/2)((M/2)-1)$ difference values, each difference value corresponding to a difference between two symbols in the M-symbol codeword.

29. A receiver circuit, comprising:
input nodes to receive an M-symbol codeword;
a first circuit, coupled to the input nodes, to output a codegroup value, wherein the codegroup value is a difference between a first sum of symbols from the M-symbol codeword and a second sum of symbols from the M-symbol codeword;
a second circuit, coupled to the input nodes, to output N difference values, N being less than $M(M-1)/2$, and each difference value corresponding to a difference between two symbols from the M-symbol codeword; and
a decoder circuit, coupled to the first circuit and the second circuit, to determine a data word corresponding to the M-symbol codeword based on the N difference values and the codegroup value.

* * * * *